US009166471B1

(12) United States Patent
Levesque et al.

(10) Patent No.: US 9,166,471 B1
(45) Date of Patent: Oct. 20, 2015

(54) 3D FREQUENCY DITHERING FOR DC-TO-DC CONVERTERS USED IN MULTI-MODE CELLULAR TRANSMITTERS

(75) Inventors: Chris Levesque, Fountain Valley, CA (US); James Retz, Cedar Rapids, IA (US); Christopher T. Ngo, Chandler, AZ (US)

(73) Assignee: RF Micro Devices, Inc., Greensboro, NC (US)

( * ) Notice: Subject to any disclaimer, the term of this patent is extended or adjusted under 35 U.S.C. 154(b) by 987 days.

(21) Appl. No.: 12/723,738

(22) Filed: Mar. 15, 2010

Related U.S. Application Data

(60) Provisional application No. 61/160,116, filed on Mar. 13, 2009.

(51) Int. Cl.
 H02M 1/44 (2007.01)
 H02M 3/157 (2006.01)
 H03K 7/08 (2006.01)

(52) U.S. Cl.
 CPC ............... *H02M 1/44* (2013.01); *H02M 3/157* (2013.01); *H03K 7/08* (2013.01)

(58) Field of Classification Search
 CPC .................................................... H02M 1/44
 USPC .......... 323/222, 282–290; 332/109–110, 123, 332/126
 See application file for complete search history.

(56) References Cited

U.S. PATENT DOCUMENTS

| 3,735,289 A | 5/1973 | Bruene |
| 4,523,155 A | 6/1985 | Walczak et al. |
| 4,638,255 A | 1/1987 | Penney |
| 4,819,081 A | 4/1989 | Volk et al. |
| 5,212,459 A | 5/1993 | Ueda et al. |
| 5,278,994 A | 1/1994 | Black et al. |
| 5,307,512 A | 4/1994 | Mitzlaff |
| 5,343,307 A | 8/1994 | Mizuno et al. |
| 5,404,547 A | 4/1995 | Diamantstein et al. |

(Continued)

FOREIGN PATENT DOCUMENTS

GB 2444984 A 6/2008

OTHER PUBLICATIONS

Non-Final Office Action for U.S. Appl. No. 12/567,318, mailed Apr. 2, 2013, 5 pages.

(Continued)

*Primary Examiner* — Harry Behm
(74) *Attorney, Agent, or Firm* — Withrow & Terranova, P.L.L.C.

(57) ABSTRACT

A circuit and method is disclosed that dithers a switching frequency of a DC-to-DC converter which gets modulated onto an RF carrier such that switching noise is spread over a given bandwidth that is wider than a communications measurements bandwidth. The circuit includes a switching circuitry adapted to transfer energy from a source to a load using a switching signal having a series of switching cycles and a switching frequency. Also included is a control circuitry adapted to generate a pseudo-random value near a beginning of each of the series of switching cycles to determine a maximum switching frequency value based upon the pseudo-random value. The method includes adjusting the switching frequency of the switching signal incrementally from a fixed minimum switching frequency value to the maximum frequency value and vice versa as a function of time during each of the series of switching cycles of the switching circuit.

15 Claims, 24 Drawing Sheets

(56) References Cited

U.S. PATENT DOCUMENTS

| | | | |
|---|---|---|---|
| 5,432,473 | A | 7/1995 | Mattila et al. |
| 5,603,106 | A | 2/1997 | Toda |
| 5,636,114 | A | 6/1997 | Bhagwat et al. |
| 5,640,686 | A | 6/1997 | Norimatsu |
| 5,642,075 | A | 6/1997 | Bell |
| 5,652,547 | A | 7/1997 | Mokhtar et al. |
| 5,724,004 | A | 3/1998 | Reif et al. |
| 5,832,373 | A | 11/1998 | Nakanishi et al. |
| 5,841,319 | A | 11/1998 | Sato |
| 5,852,632 | A | 12/1998 | Capici et al. |
| 5,860,080 | A | 1/1999 | James et al. |
| 5,872,481 | A | 2/1999 | Sevic et al. |
| 5,874,841 | A | 2/1999 | Majid et al. |
| 5,920,808 | A | 7/1999 | Jones et al. |
| 5,923,153 | A | 7/1999 | Liu |
| 5,923,761 | A | 7/1999 | Lodenius |
| 5,945,870 | A | 8/1999 | Chu et al. |
| 5,956,246 | A | 9/1999 | Sequeira et al. |
| 6,051,963 | A | 4/2000 | Eagar |
| 6,064,272 | A | 5/2000 | Rhee |
| 6,151,509 | A | 11/2000 | Chorey |
| 6,192,225 | B1 | 2/2001 | Arpaia et al. |
| 6,194,968 | B1 | 2/2001 | Winslow |
| 6,229,366 | B1 * | 5/2001 | Balakirshnan et al. ........ 327/172 |
| 6,259,901 | B1 | 7/2001 | Shinomiya et al. |
| 6,304,748 | B1 | 10/2001 | Li et al. |
| 6,425,107 | B1 | 7/2002 | Caldara et al. |
| 6,559,492 | B1 | 5/2003 | Hazucha et al. |
| 6,606,483 | B1 | 8/2003 | Baker et al. |
| 6,670,849 | B1 | 12/2003 | Damgaard et al. |
| 6,674,789 | B1 | 1/2004 | Fardoun et al. |
| 6,724,252 | B2 | 4/2004 | Ngo et al. |
| 6,774,508 | B2 | 8/2004 | Ballantyne et al. |
| 6,794,923 | B2 | 9/2004 | Burt et al. |
| 6,806,768 | B2 | 10/2004 | Klaren et al. |
| 6,853,244 | B2 | 2/2005 | Robinson et al. |
| 6,888,482 | B1 | 5/2005 | Hertle |
| 6,900,697 | B1 | 5/2005 | Doyle et al. |
| 6,906,590 | B2 | 6/2005 | Amano |
| 6,917,188 | B2 | 7/2005 | Kernahan |
| 6,937,487 | B1 | 8/2005 | Bron |
| 6,954,623 | B2 | 10/2005 | Chang et al. |
| 6,969,978 | B2 * | 11/2005 | Dening .................. 323/282 |
| 6,998,914 | B2 | 2/2006 | Robinson |
| 7,035,069 | B2 | 4/2006 | Takikawa et al. |
| 7,043,213 | B2 | 5/2006 | Robinson et al. |
| 7,058,374 | B2 * | 6/2006 | Levesque et al. ......... 455/127.3 |
| 7,072,626 | B2 | 7/2006 | Hadjichristos |
| 7,075,346 | B1 | 7/2006 | Hariman et al. |
| 7,098,728 | B1 | 8/2006 | Mei et al. |
| 7,116,949 | B2 | 10/2006 | Irie et al. |
| 7,145,385 | B2 | 12/2006 | Brandt et al. |
| 7,148,749 | B2 | 12/2006 | Rahman et al. |
| 7,154,336 | B2 | 12/2006 | Maeda |
| 7,155,251 | B2 | 12/2006 | Saruwatari et al. |
| 7,177,607 | B2 | 2/2007 | Weiss |
| 7,180,373 | B2 | 2/2007 | Imai et al. |
| 7,184,731 | B2 | 2/2007 | Kim |
| 7,184,749 | B2 | 2/2007 | Marsh et al. |
| 7,187,910 | B2 | 3/2007 | Kim et al. |
| 7,202,734 | B1 | 4/2007 | Raab |
| 7,248,111 | B1 | 7/2007 | Xu et al. |
| 7,263,337 | B2 | 8/2007 | Struble |
| 7,276,960 | B2 | 10/2007 | Peschke |
| 7,295,814 | B2 | 11/2007 | Yamashita et al. |
| 7,298,600 | B2 | 11/2007 | Takikawa et al. |
| 7,299,015 | B2 | 11/2007 | Iwamiya et al. |
| 7,324,787 | B2 | 1/2008 | Kurakami et al. |
| 7,333,564 | B2 | 2/2008 | Sugiyama et al. |
| 7,333,778 | B2 | 2/2008 | Pehlke et al. |
| 7,342,455 | B2 | 3/2008 | Behzad et al. |
| 7,358,807 | B2 | 4/2008 | Scuderi et al. |
| 7,368,985 | B2 | 5/2008 | Kusunoki |
| 7,372,333 | B2 | 5/2008 | Abedinpour et al. |
| 7,408,330 | B2 | 8/2008 | Zhao |
| 7,477,106 | B2 | 1/2009 | Van Bezooijen et al. |
| 7,483,678 | B2 | 1/2009 | Rozenblit et al. |
| 7,518,448 | B1 | 4/2009 | Blair et al. |
| 7,529,523 | B1 | 5/2009 | Young et al. |
| 7,539,462 | B2 | 5/2009 | Peckham et al. |
| 7,551,688 | B2 | 6/2009 | Matero et al. |
| 7,554,407 | B2 | 6/2009 | Hau et al. |
| 7,558,539 | B2 | 7/2009 | Huynh et al. |
| 7,580,443 | B2 * | 8/2009 | Uemura et al. ............... 375/130 |
| 7,622,900 | B2 | 11/2009 | Komiya |
| 7,664,520 | B2 | 2/2010 | Gu |
| 7,667,987 | B2 | 2/2010 | Huynh et al. |
| 7,684,220 | B2 | 3/2010 | Fang et al. |
| 7,689,182 | B1 | 3/2010 | Bosley et al. |
| 7,701,290 | B2 | 4/2010 | Liu |
| 7,702,300 | B1 | 4/2010 | McCune |
| 7,706,756 | B2 | 4/2010 | Sato et al. |
| 7,714,546 | B2 | 5/2010 | Kimura et al. |
| 7,724,097 | B2 | 5/2010 | Carley et al. |
| 7,768,354 | B2 | 8/2010 | Matsuda et al. |
| 7,782,141 | B2 | 8/2010 | Witmer et al. |
| 7,783,272 | B2 | 8/2010 | Magnusen |
| 7,787,570 | B2 | 8/2010 | Rozenblit et al. |
| 7,796,410 | B2 | 9/2010 | Takayanagi et al. |
| 7,859,511 | B2 | 12/2010 | Shen et al. |
| 7,860,466 | B2 | 12/2010 | Woo et al. |
| 7,876,159 | B2 | 1/2011 | Wang et al. |
| 7,907,430 | B2 | 3/2011 | Kularatna et al. |
| 7,941,110 | B2 | 5/2011 | Gonzalez |
| 7,995,984 | B2 | 8/2011 | Kudaishi et al. |
| 7,999,484 | B2 | 8/2011 | Jurngwirth et al. |
| 8,000,117 | B2 | 8/2011 | Petricek |
| 8,008,970 | B1 | 8/2011 | Homol et al. |
| 8,023,995 | B2 | 9/2011 | Kuriyama et al. |
| 8,031,003 | B2 | 10/2011 | Dishop |
| 8,085,106 | B2 * | 12/2011 | Huda et al. .................... 332/123 |
| 8,089,323 | B2 | 1/2012 | Tarng et al. |
| 8,098,093 | B1 | 1/2012 | Li |
| 8,131,234 | B2 | 3/2012 | Liang et al. |
| 8,134,410 | B1 | 3/2012 | Zortea |
| 8,149,050 | B2 | 4/2012 | Cabanillas |
| 8,149,061 | B2 | 4/2012 | Schuurmans |
| 8,213,888 | B2 | 7/2012 | Kuriyama et al. |
| 8,228,122 | B1 | 7/2012 | Yuen et al. |
| 8,258,875 | B1 | 9/2012 | Smith et al. |
| 8,271,028 | B2 | 9/2012 | Rabjohn |
| 8,427,120 | B1 | 4/2013 | Cilio |
| 8,461,921 | B2 | 6/2013 | Pletcher et al. |
| 8,508,299 | B2 | 8/2013 | Kawano et al. |
| 8,514,025 | B2 | 8/2013 | Lesso |
| 8,546,980 | B2 | 10/2013 | Shimamoto et al. |
| 8,564,366 | B2 | 10/2013 | Namie et al. |
| 8,649,741 | B2 | 2/2014 | Iijima et al. |
| 2002/0055376 | A1 | 5/2002 | Norimatsu |
| 2002/0055378 | A1 | 5/2002 | Imel et al. |
| 2003/0006845 | A1 | 1/2003 | Lopez et al. |
| 2003/0042885 | A1 | 3/2003 | Zhou et al. |
| 2003/0073418 | A1 | 4/2003 | Dening et al. |
| 2003/0087626 | A1 | 5/2003 | Prikhodko et al. |
| 2003/0201674 | A1 | 10/2003 | Droppo et al. |
| 2003/0201834 | A1 | 10/2003 | Pehlke |
| 2003/0227280 | A1 | 12/2003 | Vinciarelli |
| 2004/0068673 | A1 | 4/2004 | Espinoza-Ibarra et al. |
| 2004/0090802 | A1 | 5/2004 | Pourseyed et al. |
| 2004/0095118 | A1 | 5/2004 | Kernahan |
| 2004/0127173 | A1 | 7/2004 | Leizerovich |
| 2004/0183507 | A1 | 9/2004 | Amei |
| 2004/0185805 | A1 | 9/2004 | Kim et al. |
| 2004/0192369 | A1 | 9/2004 | Nilsson |
| 2004/0222848 | A1 | 11/2004 | Shih et al. |
| 2004/0235438 | A1 | 11/2004 | Quilisch et al. |
| 2005/0003855 | A1 | 1/2005 | Wada et al. |
| 2005/0017787 | A1 | 1/2005 | Kojima |
| 2005/0046507 | A1 | 3/2005 | Dent |
| 2005/0064830 | A1 | 3/2005 | Grigore |
| 2005/0083715 | A1 | 4/2005 | Guillarme et al. |
| 2005/0088237 | A1 | 4/2005 | Gamero et al. |
| 2005/0110559 | A1 | 5/2005 | Farkas et al. |
| 2005/0134388 | A1 | 6/2005 | Jenkins |

(56) References Cited

U.S. PATENT DOCUMENTS

| | | |
|---|---|---|
| 2005/0136854 A1 | 6/2005 | Akizuki et al. |
| 2005/0136866 A1 | 6/2005 | Dupuis |
| 2005/0168281 A1 | 8/2005 | Nagamori et al. |
| 2005/0200407 A1 | 9/2005 | Arai et al. |
| 2005/0227644 A1 | 10/2005 | Maslennikov et al. |
| 2005/0245214 A1 | 11/2005 | Nakamura et al. |
| 2005/0280471 A1 | 12/2005 | Matsushita et al. |
| 2005/0288052 A1 | 12/2005 | Carter et al. |
| 2005/0289375 A1 | 12/2005 | Ranganathan et al. |
| 2006/0006943 A1 | 1/2006 | Clifton et al. |
| 2006/0017426 A1* | 1/2006 | Yang et al. ............ 323/283 |
| 2006/0038710 A1 | 2/2006 | Staszewski et al. |
| 2006/0046666 A1 | 3/2006 | Hara et al. |
| 2006/0046668 A1 | 3/2006 | Uratani et al. |
| 2006/0052065 A1 | 3/2006 | Argaman et al. |
| 2006/0067425 A1 | 3/2006 | Windisch |
| 2006/0084398 A1 | 4/2006 | Chmiel et al. |
| 2006/0114075 A1 | 6/2006 | Janosevic et al. |
| 2006/0119331 A1 | 6/2006 | Jacobs et al. |
| 2006/0128325 A1 | 6/2006 | Levesque et al. |
| 2006/0146956 A1 | 7/2006 | Kim et al. |
| 2006/0199553 A1 | 9/2006 | Kenington |
| 2006/0221646 A1* | 10/2006 | Ye et al. ............... 363/13 |
| 2006/0226909 A1 | 10/2006 | Abedinpour et al. |
| 2006/0290444 A1 | 12/2006 | Chen |
| 2006/0293005 A1 | 12/2006 | Hara et al. |
| 2007/0024360 A1 | 2/2007 | Markowski |
| 2007/0026824 A1 | 2/2007 | Ono et al. |
| 2007/0032201 A1 | 2/2007 | Behzad et al. |
| 2007/0069820 A1 | 3/2007 | Hayata et al. |
| 2007/0096806 A1 | 5/2007 | Sorrells et al. |
| 2007/0096810 A1 | 5/2007 | Hageman et al. |
| 2007/0129025 A1 | 6/2007 | Vasa et al. |
| 2007/0146090 A1 | 6/2007 | Carey et al. |
| 2007/0182490 A1 | 8/2007 | Hau et al. |
| 2007/0210776 A1* | 9/2007 | Oka ..................... 323/283 |
| 2007/0222520 A1 | 9/2007 | Inamori et al. |
| 2007/0249300 A1 | 10/2007 | Sorrells et al. |
| 2007/0249304 A1 | 10/2007 | Snelgrove et al. |
| 2007/0279021 A1 | 12/2007 | Yanagida et al. |
| 2007/0281635 A1 | 12/2007 | McCallister et al. |
| 2007/0291873 A1 | 12/2007 | Saito et al. |
| 2008/0003950 A1* | 1/2008 | Haapoja et al. ............ 455/73 |
| 2008/0008273 A1 | 1/2008 | Kim et al. |
| 2008/0009248 A1 | 1/2008 | Rozenblit et al. |
| 2008/0023825 A1 | 1/2008 | Hebert et al. |
| 2008/0036532 A1 | 2/2008 | Pan |
| 2008/0051044 A1 | 2/2008 | Takehara |
| 2008/0057883 A1 | 3/2008 | Pan |
| 2008/0081572 A1 | 4/2008 | Rofougaran |
| 2008/0136559 A1 | 6/2008 | Takahashi et al. |
| 2008/0157732 A1 | 7/2008 | Williams |
| 2008/0169792 A1 | 7/2008 | Orr |
| 2008/0205547 A1 | 8/2008 | Rofougaran |
| 2008/0233913 A1 | 9/2008 | Sivasubramaniam |
| 2008/0278136 A1 | 11/2008 | Murtojarvi |
| 2008/0278236 A1 | 11/2008 | Seymour |
| 2009/0004981 A1 | 1/2009 | Eliezer et al. |
| 2009/0011787 A1 | 1/2009 | Kikuma |
| 2009/0021302 A1 | 1/2009 | Elia |
| 2009/0059630 A1 | 3/2009 | Williams |
| 2009/0068966 A1 | 3/2009 | Drogi et al. |
| 2009/0104900 A1 | 4/2009 | Lee |
| 2009/0115520 A1 | 5/2009 | Ripley et al. |
| 2009/0153250 A1 | 6/2009 | Rofougaran |
| 2009/0163153 A1 | 6/2009 | Senda et al. |
| 2009/0163157 A1 | 6/2009 | Zolfaghari |
| 2009/0176464 A1 | 7/2009 | Liang et al. |
| 2009/0191826 A1 | 7/2009 | Takinami et al. |
| 2009/0258611 A1 | 10/2009 | Nakamura et al. |
| 2009/0264091 A1 | 10/2009 | Jensen et al. |
| 2009/0274207 A1 | 11/2009 | O'Keeffe et al. |
| 2009/0285331 A1 | 11/2009 | Sugar et al. |
| 2009/0289719 A1 | 11/2009 | Van Bezooijen et al. |
| 2009/0311980 A1 | 12/2009 | Sjoland |
| 2009/0322304 A1 | 12/2009 | Oraw et al. |
| 2010/0007412 A1 | 1/2010 | Wang et al. |
| 2010/0007414 A1 | 1/2010 | Searle et al. |
| 2010/0007433 A1 | 1/2010 | Jensen |
| 2010/0013548 A1 | 1/2010 | Barrow |
| 2010/0020899 A1 | 1/2010 | Szopko et al. |
| 2010/0027596 A1 | 2/2010 | Bellaouar et al. |
| 2010/0029224 A1 | 2/2010 | Urushihara et al. |
| 2010/0052794 A1 | 3/2010 | Rofougaran |
| 2010/0097104 A1 | 4/2010 | Yang et al. |
| 2010/0102789 A1 | 4/2010 | Randall |
| 2010/0109561 A1 | 5/2010 | Chen et al. |
| 2010/0120384 A1 | 5/2010 | Pennec |
| 2010/0120475 A1 | 5/2010 | Taniuchi et al. |
| 2010/0123447 A1 | 5/2010 | Vecera et al. |
| 2010/0127781 A1 | 5/2010 | Inamori et al. |
| 2010/0128689 A1 | 5/2010 | Yoon et al. |
| 2010/0164579 A1 | 7/2010 | Acatrinei |
| 2010/0176869 A1 | 7/2010 | Horie et al. |
| 2010/0181980 A1 | 7/2010 | Richardson |
| 2010/0189042 A1 | 7/2010 | Pan |
| 2010/0222015 A1 | 9/2010 | Shimizu et al. |
| 2010/0233977 A1 | 9/2010 | Minnis et al. |
| 2010/0237944 A1 | 9/2010 | Pierdomenico et al. |
| 2010/0244788 A1 | 9/2010 | Chen |
| 2010/0273535 A1 | 10/2010 | Inamori et al. |
| 2010/0291888 A1 | 11/2010 | Hadjichristos et al. |
| 2010/0295599 A1 | 11/2010 | Uehara et al. |
| 2010/0311362 A1 | 12/2010 | Lee et al. |
| 2011/0018516 A1 | 1/2011 | Notman et al. |
| 2011/0018632 A1 | 1/2011 | Pletcher et al. |
| 2011/0018640 A1 | 1/2011 | Liang et al. |
| 2011/0032030 A1 | 2/2011 | Ripley et al. |
| 2011/0051842 A1 | 3/2011 | van der Heijden et al. |
| 2011/0068768 A1 | 3/2011 | Chen et al. |
| 2011/0068873 A1 | 3/2011 | Alidio et al. |
| 2011/0075772 A1 | 3/2011 | Sethi et al. |
| 2011/0080205 A1 | 4/2011 | Lee |
| 2011/0095735 A1 | 4/2011 | Lin |
| 2011/0123048 A1 | 5/2011 | Wang et al. |
| 2011/0136452 A1 | 6/2011 | Pratt et al. |
| 2011/0181115 A1 | 7/2011 | Ivanov |
| 2011/0234187 A1 | 9/2011 | Brown et al. |
| 2011/0273152 A1 | 11/2011 | Weir |
| 2011/0294445 A1 | 12/2011 | Goto et al. |
| 2011/0298538 A1 | 12/2011 | Andrys et al. |
| 2011/0309884 A1 | 12/2011 | Dishop |
| 2011/0312287 A1 | 12/2011 | Ramachandran et al. |
| 2012/0044022 A1 | 2/2012 | Walker et al. |
| 2012/0064953 A1 | 3/2012 | Dagher et al. |
| 2012/0182086 A1 | 7/2012 | Hase et al. |
| 2012/0229210 A1 | 9/2012 | Jones et al. |
| 2012/0235736 A1 | 9/2012 | Levesque et al. |
| 2012/0236958 A1 | 9/2012 | Deng et al. |
| 2012/0242413 A1 | 9/2012 | Lesso |
| 2012/0252382 A1 | 10/2012 | Bashir et al. |
| 2013/0005286 A1 | 1/2013 | Chan et al. |
| 2013/0307616 A1 | 11/2013 | Berchtold et al. |
| 2013/0342270 A1 | 12/2013 | Baxter et al. |
| 2013/0344828 A1 | 12/2013 | Baxter et al. |
| 2013/0344833 A1 | 12/2013 | Baxter et al. |
| 2014/0119070 A1 | 5/2014 | Jeong et al. |

OTHER PUBLICATIONS

Notice of Allowance for U.S. Appl. No. 13/198,074, mailed Apr. 12, 2013, 8 pages.

Non-Final Office Action for U.S. Appl. No. 13/287,726, mailed May 16, 2013, 9 pages.

Non-Final Office Action for U.S. Appl. No. 13/288,517, mailed May 16, 2013, 9 pages.

Non-Final Office Action for U.S. Appl. No. 13/226,843, mailed Mar. 4, 2013, 6 pages.

Non-Final Office Action for U.S. Appl. No. 13/288,373, mailed Feb. 25, 2013, 6 pages.

Non-Final Office Action for U.S. Appl. No. 13/289,379, mailed Feb. 25, 2013, 9 pages.

Non-Final Office Action for U.S. Appl. No. 13/305,763, mailed Mar. 8, 2013, 10 pages.

(56) References Cited

OTHER PUBLICATIONS

Notice of Allowance for U.S. Appl. No. 13/304,762, mailed Mar. 5, 2013, 7 pages.
Notice of Allowance for U.S. Appl. No. 13/226,797, mailed Apr. 26, 2013, 8 pages.
International Search Report and Written Opinion for PCT/US2011/050633, mailed Mar. 8, 2013, 23 pages.
International Preliminary Report on Patentability for PCT/US2011/050633, mailed Mar. 28, 2013, 17 pages.
Author Unknown, "60mA, 5.0V, Buck/Boost Charge Pump in ThinSOT-23 and ThinQFN", Texas Instruments Incorporated, REG710, SBAS221F, Dec. 2001, revised Mar. 2008, 23 pages.
Author Unknown, "DC-to-DC Converter Combats EMI," Maxim Integrated Products, Application Note 1077, May 28, 2002, 4 pages, http://www.maxim-ic.com/an1077/.
Bastida, E.M. et al., "Cascadable Monolithic Balanced Amplifiers at Microwave Frequencies," 10th European Microwave Conference, Sep. 8-12, 1980, pp. 603-607, IEEE.
Berretta, G. et al., "A balanced CDMA2000 SiGe HBT load insensitive power amplifier," 2006 IEEE Radio and Wireless Symposium, Jan. 17-19, 2006, pp. 523-526, IEEE.
Grebennikov, A. et al., "High-Efficiency Balanced Switched-Path Monolithic SiGe HBT Power Amplifiers for Wireless Applications," Proceedings of the 2nd European Microwave Integrated Circuits Conference, Oct. 8-10, 2007, pp. 391-394, IEEE.
Grebennikov, A., "Circuit Design Technique for High Efficiency Class F Amplifiers," 2000 IEEE International Microwave Symposium Digest, Jun. 11-16, 2000, pp. 771-774, vol. 2, IEEE.
Kurokawa, K., "Design Theory of Balanced Transistor Amplifiers," Bell System Technical Journal, Oct. 1965, pp. 1675-1698, vol. 44, Bell Labs.
Li, Y. et al., "LTE power amplifier module design: challenges and trends," IEEE International Conference on Solid-State and Integrated Circuit Technology, Nov. 2010, pp. 192-195.
Mandeep, J.S. et al., "A Compact, Balanced Low Noise Amplifier for WiMAX Base Station Applications", Microwave Journal, Nov. 2010, p. 84-92, vol. 53, No. 11, Microwave Journal and Horizon House Publications.
Podcameni, A.B. et al., "An amplifier linearization method based on a quadrature balanced structure," IEEE Transactions on Broadcasting, Jun. 2002, p. 158-162, vol. 48, No. 2, IEEE.
Scuderi, A. et al., "Balanced SiGe PA Module for Multi-Band and Multi-Mode Cellular-Phone Applications," Digest of Technical Papers, 2008 IEEE International Solid-State Circuits Conference, Feb. 3-7, 2008, pp. 572-573, 637, IEEE.
Wang, P. et al., "A 2.4-GHz +25dBm P-1dB linear power amplifier with dynamic bias control in a 65-nm CMOS process," 2008 European Solid-State Circuits Conference, Sep. 15-19, 2008, pp. 490-493.
Zhang, G. et al., "A high performance Balanced Power Amplifier and Its Integration into a Front-end Module at PCS Band," 2007 IEEE Radio Frequency Integrated Circuits Symposium, Jun. 3-5, 2007, p. 251-254, IEEE.
Zhang, G. et al., "Dual mode efficiency enhanced linear power amplifiers using a new balanced structure," 2009 IEEE Radio Frequency Integrated Circuits Symposium, Jun. 7-9, 2009, pp. 245-248, IEEE.
Author Unknown, "MIPI Alliance Specification for RF Front-End Control Interface", Mobile Industry Processor Interface (MIPI) Alliance, Version 1.00.00, May 3, 2010, approved Jul. 16, 2010, 88 pages.
Author Unknown, "SKY77344-21 Power Amplifier Module—Evaluation Information," Skyworks Solutions, Inc., Version-21, Feb. 16, 2010, 21 pages.
Non-Final Office Action for U.S. Appl. No. 11/756,909, mailed May 15, 2009, 11 pages.
Final Office Action for U.S. Appl. No. 11/756,909, mailed Nov. 18, 2009, 14 pages.
Notice of Allowance for U.S. Appl. No. 11/756,909, mailed Dec. 23, 2010, 7 pages.
Non-Final Office Action for U.S. Appl. No. 12/567,318, mailed May 29, 2012, 7 pages.
Final Office Action for U.S. Appl. No. 12/567,318, mailed Oct. 22, 2012, 7 pages.
Quayle Action for U.S. Appl. No. 13/198,074, mailed Jan. 22, 2013, 5 pages.
Notice of Allowance for U.S. Appl. No. 13/090,663, mailed Nov. 28, 2012, 8 pages.
Invitation to Pay Additional Fees and, Where Applicable, Protest Fee for PCT/US2011/050633, mailed Aug. 22, 2012, 5 pages.
Non-Final Office Action for U.S. Appl. No. 13/289,134, mailed Feb. 6, 2013, 13 pages.
Non-Final Office Action for U.S. Appl. No. 13/287,726, mailed Jan. 25, 2013, 11 pages.
Non-Final Office Action for U.S. Appl. No. 13/287,735, mailed Jan. 25, 2013, 11 pages.
Non-Final Office Action for U.S. Appl. No. 13/288,318, mailed Feb. 5, 2013, 12 pages.
Non-Final Office Action for U.S. Appl. No. 13/288,478, mailed Dec. 26, 2012, 8 pages.
Non-Final Office Action for U.S. Appl. No. 13/288,517, mailed Dec. 11, 2012, 9 pages.
Non-Final Office Action for U.S. Appl. No. 13/288,273, mailed Feb. 5, 2013, 8 pages.
Non-Final Office Action for U.S. Appl. No. 13/304,744, mailed Jan. 24, 2013, 10 pages.
Notice of Allowance for U.S. Appl. No. 13/304,762, mailed Nov. 27, 2012, 7 pages.
Notice of Allowance for U.S. Appl. No. 12/567,318, mailed Feb. 18, 2014, 8 pages.
Advisory Action for U.S. Appl. No. 13/287,713, mailed Feb. 20, 2014, 4 pages.
Non-Final Office Action for U.S. Appl. No. 13/288,517, mailed Apr. 28, 2014, 10 pages.
Non-Final Office Action for U.S. Appl. No. 13/226,843, mailed Mar. 31, 2014, 7 pages.
Notice of Allowance for U.S. Appl. No. 13/288,273, mailed Apr. 25, 2014, 7 pages.
Notice of Allowance for U.S. Appl. No. 13/288,373, mailed May 7, 2014, 7 pages.
Non-Final Office Action for U.S. Appl. No. 13/288,590, mailed May 8, 2014, 11 pages.
Notice of Allowance for U.S. Appl. No. 13/304,762, mailed Apr. 16, 2014, 7 pages.
Final Office Action for U.S. Appl. No. 13/226,777, mailed Mar. 21, 2014, 13 pages.
Non-Final Office Action for U.S. Appl. No. 13/656,997, mailed Apr. 30, 2014, 8 pages.
Notice of Allowance for U.S. Appl. No. 12/774,155, mailed Jun. 20, 2014, 8 pages.
Non-Final Office Action for U.S. Appl. No. 14/010,617, mailed Jul. 16, 2014, 6 pages.
Non-Final Office Action for U.S. Appl. No. 14/010,643, mailed Jul. 18, 2014, 6 pages.
Non-Final Office Action for U.S. Appl. No. 13/172,371, mailed Jun. 16, 2014, 7 pages.
Notice of Allowance for U.S. Appl. No. 13/287,726, mailed Aug. 4, 2014, 7 page.
Non-Final Office Action for U.S. Appl. No. 13/287,672, mailed Jul. 28, 2014, 12 pages.
Non-Final Office Action for U.S. Appl. No. 13/289,302, mailed Jun. 16, 2014, 7 pages.
Notice of Allowance for U.S. Appl. No. 13/304,762, mailed May 29, 2014, 7 pages.
Non-Final Office Action for U.S. Appl. No. 13/773,888, mailed Jun. 10, 2014, 15 pages.
Non-Final Office Action for U.S. Appl. No. 14/010,630, mailed Aug. 6, 2014, 7 pages.
Notice of Allowance for U.S. Appl. No. 13/288,517, mailed Aug. 15, 2014, 7 pages.
Notice of Allowance for U.S. Appl. No. 13/656,997, mailed Sep. 2, 2014, 7 pages.
Notice of Allowance for U.S. Appl. No. 13/761,500, mailed Sep. 19, 2014, 7 pages.

(56) References Cited

OTHER PUBLICATIONS

Notice of Allowance for U.S. Appl. No. 14/010,617, mailed Dec. 16, 2014, 7 pages.
Notice of Allowance for U.S. Appl. No. 14/010,630, mailed Dec. 31, 2014, 9 pages.
Non-Final Office Action for U.S. Appl. No. 14/010,643, mailed Dec. 9, 2014, 7 pages.
Notice of Allowance for U.S. Appl. No. 13/911,526, mailed Dec. 12, 2014, 9 pages.
Final Office Action for U.S. Appl. No. 13/287,672, mailed Dec. 8, 2014, 14 pages.
Final Office Action for U.S. Appl. No. 13/773,888, mailed Dec. 26, 2014, 18 pages.
Author Unknown, "3rd Generation Partnership Project; Technical Specification Group Radio Access Network; Evolved Universal Terrestrial Radio Access (E-UTRA); User Equipment (UE) radio transmission and reception (Release 10)," 3GPP TS 36.101, V10.2.1, Apr. 2011, 225 pages.
Li, C.H., "Quadrature Power Amplifier for RF Applications," Master's Thesis for the University of Twente, Nov. 2009, 102 pages.
Non-Final Office Action for U.S. Appl. No. 13/226,831, mailed Nov. 3, 2014, 12 pages.
Non-Final Office Action for U.S. Appl. No. 13/479,816, mailed Nov. 4, 2014, 11 pages.
Non-Final Office Action for U.S. Appl. No. 13/754,303, mailed Oct. 14, 2014, 14 pages.
Non-Final Office Action for U.S. Appl. No. 13/845,410, mailed Oct. 2, 2014, 5 pages.
Final Office Action for U.S. Appl. No. 13/226,831, mailed Mar. 6, 2015, 6 pages.
Non-Final Office Action for U.S. Appl. No. 13/937,810, mailed Mar. 5, 2015, 5 pages.
Non-Final Office Action for U.S. Appl. No. 13/287,672, mailed Mar. 23, 2015, 7 pages.
Notice of Allowance for U.S. Appl. No. 13/754,303, mailed Feb. 17, 2015, 8 pages.
Author Unknown, "SKY77344-21 Power Amplifier Module—Evaluation Information," Skyworks, Version 21, Feb. 16, 2010, 21 pages.
Noriega, Fernando et al., "Designing LC Wilkinson power splitters," RF interconnects/interfaces, Aug. 2002, pp. 18, 20, 22, and 24, www.rfdesign.com.
Pampichai, Samphan et al., "A 3-dB Lumped-Distributed Miniaturized Wilkinson Divider," Electrical Engineering Conference (EECON-23), Nov. 2000, pp. 329-332.
Non-Final Office Action for U.S. Appl. No. 12/433,377, mailed Jun. 16, 2011, 7 pages.
Notice of Allowance for U.S. Appl. No. 12/433,377, mailed Oct. 31, 2011, 8 pages.
Non-Final Office Action for U.S. Appl. No. 12/774,155, mailed Jun. 21, 2012, 18 pages.
Final Office Action for U.S. Appl. No. 12/774,155, mailed Jan. 31, 2013, 15 pages.
Final Office Action for U.S. Appl. No. 12/774,155, mailed Apr. 18, 2013, 15 pages.
Advisory Action for U.S. Appl. No. 12/774,155, mailed Jun. 4, 2013, 3 pages.
Non-Final Office Action for U.S. Appl. No. 12/774,155, mailed Aug. 15, 2013, 15 pages.
Non-Final Office Action for U.S. Appl. No. 12/749,091, mailed Mar. 25, 2013, 9 pages.
Notice of Allowance for U.S. Appl. No. 12/749,091, mailed May 20, 2013, 9 pages.
Notice of Allowance for U.S. Appl. No. 12/773,292, mailed Feb. 22, 2012, 11 pages.
Notice of Allowance for U.S. Appl. No. 12/773,292, mailed Jul. 16, 2012, 12 pages.
Non-Final Office Action for U.S. Appl. No. 13/019,077, mailed Feb. 19, 2013, 9 pages.
Notice of Allowance for U.S. Appl. No. 13/019,077, mailed May 24, 2013, 9 pages.
Notice of Allowance for U.S. Appl. No. 13/288,318, mailed Oct. 24, 2013, 9 pages.
Notice of Allowance for U.S. Appl. No. 13/288,273 mailed Oct. 24, 2013, 9 pages.
Advisory Action for U.S. Appl. No. 13/288,373, mailed Oct. 15, 2013, 3 pages.
Advisory Action for U.S. Appl. No. 13/304,744, mailed Sep. 13, 2013, 3 pages.
Non-Final Office Action for U.S. Appl. No. 13/304,744, mailed Oct. 21, 2013, 12 pages.
Notice of Allowance for U.S. Appl. No. 13/305,763, mailed Sep. 16, 2013, 6 pages.
Non-Final Office Action for U.S. Appl. No. 13/226,777, mailed Oct. 18, 2013, 10 pages.
Final Office Action for U.S. Appl. No. 13/226,814, mailed Oct. 23, 2013, 21 pages.
Advisory Action for U.S. Appl. No. 12/567,318, mailed Aug. 27, 2013, 3 pages.
Non-Final Office Action for U.S. Appl. No. 12/567,318, mailed Oct. 24, 2013, 6 pages.
Advisory Action for U.S. Appl. No. 13/226,843, mailed Sep. 17, 2013, 3 pages.
Non-Final Office Action for U.S. Appl. No. 13/226,843, mailed Oct. 29, 2013, 7 pages.
Notice of Allowance for U.S. Appl. No. 13/287,726, mailed Oct. 7, 2013, 9 pages.
Final Office Action for U.S. Appl. No. 12/567,318, mailed Jul. 19, 2013, 7 pages.
Notice of Allowance for U.S. Appl. No. 13/289,134, mailed Jun. 6, 2013, 8 pages.
Non-Final Office Action for U.S. Appl. No. 13/287,713, mailed Aug. 5, 2013, 7 pages.
Notice of Allowance for U.S. Appl. No. 13/287,735, mailed May 28, 2013, 8 pages.
Non-Final Office Action for U.S. Appl. No. 13/288,318, mailed Jun. 3, 2013, 14 pages.
Non-Final Office Action for U.S. Appl. No. 13/288,478, mailed Jun. 3, 2013, 9 pages.
Final Office Action for U.S. Appl. No. 13/226,843, mailed Jul. 10, 2013, 7 pages.
Non-Final Office Action for U.S. Appl. No. 13/288,273, mailed May 30, 2013, 11 pages.
Final Office Action for U.S. Appl. No. 13/288,373, mailed Aug. 2, 2013, 7 pages.
Notice of Allowance for U.S. Appl. No. 13/289,379, mailed Jun. 6, 2013, 9 pages.
Non-Final Office Action for U.S. Appl. No. 13/304,735, mailed Jul. 11, 2013, 8 pages.
Non-Final Office Action for U.S. Appl. No. 13/304,796, mailed Jul. 17, 2013, 8 pages.
Final Office Action for U.S. Appl. No. 13/304,744, mailed May 30, 2013, 12 pages.
Advisory Action for U.S. Appl. No. 13/304,744, mailed Aug. 2, 2013, 3 pages.
Final Office Action for U.S. Appl. No. 13/305,763, mailed Jun. 24, 2013, 13 pages.
Non-Final Office Action for U.S. Appl. No. 13/304,943, mailed Jul. 23, 2013, 8 pages.
Notice of Allowance for U.S. Appl. No. 13/226,777, mailed May 28, 2013, 8 pages.
Non-Final Office Action for U.S. Appl. No. 13/226,814, mailed Jun. 13, 2013, 13 pages.
Non-Final Office Action for U.S. Appl. No. 13/479,816, mailed Jul. 5, 2013, 13 pages.
Non-Final Office Action for U.S. Appl. No. 12/774,155, mailed Dec. 4, 2013, 18 pages.
Final Office Action for U.S. Appl. No. 13/287,713, mailed Dec. 6, 2013, 9 pages.
Notice of Allowance for U.S. Appl. No. 13/288,478, mailed Nov. 18, 2013, 9 pages.

(56) References Cited

OTHER PUBLICATIONS

Non-Final Office Action for U.S. Appl. No. 13/288,517, mailed Oct. 31, 2013, 10 pages.
Non-Final Office Action for U.S. Appl. No. 13/288,373, mailed Nov. 19, 2013, 5 pages.
Non-Final Office Action for U.S. Appl. No. 13/288,590, mailed Dec. 5, 2013, 8 pages.
Notice of Allowance for U.S. Appl. No. 13/304,735, mailed Jan. 2, 2014, 8 pages.
Notice of Allowance for U.S. Appl. No. 13/304,796, mailed Dec. 5, 2013, 9 pages.
Notice of Allowance for U.S. Appl. No. 13/304,943, mailed Dec. 5, 2013, 9 pages.
Advisory Action for U.S. Appl. No. 13/226,814, mailed Dec. 31, 2013, 3 pages.
Final Office Action for U.S. Appl. No. 13/479,816, mailed Nov. 1, 2013, 15 pages.
Advisory Action for U.S. Appl. No. 13/479,816, mailed Jan. 7, 2014, 3 pages.
Non-Final Office Action for U.S. Appl. No. 13/656,997, mailed Jan. 13, 2014, 6 pages.
Final Office Action for U.S. Appl. No. 14/010,643, mailed May 5, 2015, 8 pages.
Advisory Action for U.S. Appl. No. 13/226,831 mailed May 13, 2015, 3 pages.
Notice of Allowance for U.S. Appl. No. 13/937,810, mailed Jun. 24, 2015, 5 pages.
Notice of Allowance for U.S Appl. No. 14/010,643, mailed Jul. 10, 2015, 7 pages.
Non-Final Office Action for U.S. Appl. No. 13/911,428, mailed Jul. 22, 2015, 10 pages.
Notice of Allowance for U.S. Appl. No. 13/226,831, mailed Aug. 3, 2015, 9 pages.
Final Office Action for U.S. Appl. No. 13/287,672, mailed Jul. 17, 2015, 8 pages.
Non-Final Office Action for U.S. Appl. No. 13/773,888, mailed Aug. 27, 2015, 17 pages.

* cited by examiner

ADDRESS DECODER LOGIC TRUTH TABLE

| DITHERINGCTRL[2:0] | | | DESCRIPTION | DITHERING SEQUENCE | | DITHERING MODE | |
|---|---|---|---|---|---|---|---|
| | | | | LINEAR | RANDOM | SLOW | FAST |
| 0 | 0 | 0 | 000 = DITHERING OFF (SWITCHING FREQUENCY SET BY Fmin[5:0]) | 0 | 0 | 0 | 0 |
| 0 | 0 | 1 | 001 = SLOW DITHERING LINEAR | 1 | 0 | 1 | 0 |
| 0 | 1 | 0 | 010 = SLOW DITHERING RANDOM | 0 | 1 | 1 | 0 |
| 0 | 1 | 1 | 011 = FAST DITHERING LINEAR | 1 | 0 | 0 | 1 |
| 1 | 0 | 0 | 100 = FAST DITHERING RANDOM | 0 | 1 | 0 | 1 |
| 1 | 0 | 1 | 101 = 3D DITHERING (SLOW RANDOM AND FAST ARE LINEAR) | 1 | 1 | 1 | 1 |
| 1 | 1 | 0 | 110 = RESERVED FOR FUTURE USE | 0 | 0 | 0 | 0 |
| 1 | 1 | 1 | 111 = RESERVED FOR FUTURE USE | 0 | 0 | 0 | 0 |

*FIG. 8*

RANDOMSPAN TO MLSRCTRL DECODER TRUTH TABLE

| RANDOMSPAN[1:0] | | DESCRIPTION | MLSRCTRL | | | | |
|---|---|---|---|---|---|---|---|
| | | | 4 | 3 | 2 | 1 | 0 |
| 0 | 0 | 3 BITS | X | X | 0 | 0 | 1 |
| 0 | 0 | 4 BITS | X | 1 | 1 | 0 | 0 |
| 0 | 1 | 5 BITS | 1 | 0 | 1 | 0 | 0 |
| 1 | 1 | FULL SPAN (6 BITS) | 0 | 0 | 0 | 1 | 0 |

*FIG. 10*

| EXPECTED DECIMAL VALUES | | | |
|---|---|---|---|
| 3BIT | 4BIT | 5BIT | 6BIT |
| 1 | 1 | 1 | 1 |
| 6 | 12 | 20 | 48 |
| 3 | 6 | 10 | 24 |
| 7 | 3 | 5 | 12 |
| 5 | 13 | 22 | 6 |
| 4 | 10 | 11 | 3 |
| 2 | 5 | 17 | 49 |
| | 14 | 28 | 40 |
| | 7 | 14 | 20 |
| | 15 | 7 | 10 |
| | 11 | 23 | 5 |
| | 9 | 31 | 50 |
| | 8 | 27 | 25 |
| | 4 | 25 | 60 |
| | 2 | 24 | 30 |
| | | 12 | 15 |
| | | 6 | 55 |
| | | 3 | 43 |
| | | 21 | 37 |
| | | 30 | 34 |
| | | 15 | 17 |
| | | 19 | 56 |
| | | 29 | 28 |
| | | 26 | 14 |
| | | 13 | 7 |
| | | 18 | 51 |
| | | 9 | 41 |
| | | 16 | 36 |
| | | 8 | 18 |
| | | 4 | 9 |
| | | 2 | 52 |

| 6BIT (cont.) |
|---|
| 26 |
| 13 |
| 54 |
| 27 |
| 61 |
| 46 |
| 23 |
| 59 |
| 45 |
| 38 |
| 19 |
| 57 |
| 44 |
| 22 |
| 11 |
| 53 |
| 42 |
| 21 |
| 58 |
| 29 |
| 62 |
| 31 |
| 63 |
| 47 |
| 39 |
| 35 |
| 33 |
| 32 |
| 16 |
| 8 |
| 4 |
| 2 |

FIG. 11

3D FREQUENCY DITHERING FOR DC-TO-DC CONVERTERS USED IN MULTI-MODE CELLULAR TRANSMITTERS

RELATED APPLICATIONS

This application claims the benefit of provisional patent application Ser. No. 61/60,116, filed Mar. 13, 2009, the disclosure of which is hereby incorporated herein by reference in its entirety. This application also relates to co-pending U.S. patent application Ser. No. 11/756,909, now U.S. Pat. No. 7,928,712, entitled "Low Noise Fast Dithering Switching Power Supply", filed on Jun. 1, 2007.

FIELD OF THE DISCLOSURE

The present disclosure relates to switching power supplies that may be used in radio frequency (RF) communications circuits.

BACKGROUND

A desirable component for a mobile phone is a switching power supply such as a direct current to direct current (DC-to-DC) converter that transfers energy from a source to a load. Typically, DC-to-DC converters offer much greater efficiencies than do linear voltage regulators while regulating power being transferred to a load such as the circuitry of a mobile phone. However, linear voltage regulators at present offer an advantage by generating much less spectral noise than DC-to-DC converters. Moreover, incorporating DC-to-DC converters into mobile phone circuitry is made more problematic by third-generation (3G) and later mobile phone standards, which are increasingly restrictive with regard to spurious radio frequency (RF) transmissions. As a result of a need to reduce spurious RF transmissions from mobile phones, any leakage of DC-to-DC converter switching noise into a mobile phone's transmitter circuitry is preferably reduced. Traditional attempts to reduce switching noise leakage have resulted in either prohibitively expensive filtering components or unacceptable results when mobile phone emission standards are applied.

Making the switching noise of a DC-to-DC converter less periodic by a frequency dithering of the DC-to-DC converter's switching signal is helpful. However, unlike a frequency dithering scheme for a crystal oscillator that provides acceptable electromagnetic interference (EMI) performance, a frequency dithering of a DC-to-DC converter's switching signal often results in an unacceptable increase in output voltage ripple. One reason for the increase in output voltage ripple is that a fundamental criterion for steady state operation of a DC-to-DC converter is violated by using frequency dithering.

Typical DC-to-DC converters have two distinct phases of operation. A first phase occurs when energy is stored in an inductor's magnetic field, and a second phase occurs when the stored energy is transferred to a load. An imbalance of energy transfer will often result in either an energy buildup in the inductor's magnetic field or a collapse of the inductor's magnetic field. As a result, undesirable output voltage variations will likely occur as an inductor current creating the inductor's magnetic field is integrated by one or more output filter capacitors. A resulting output voltage ripple will increase as a charge transfer to the filter capacitors becomes imbalanced. As illustrated in FIG. 1, the inductor current will show an imbalance as a pulse width modulated (PWM) switching signal is stepped from one period to another. In other words, the changes in switching signal frequency may introduce a variation of the inductor average current, which in turn results in an undesirable output voltage ripple. In FIG. 1, the switching signal labeled "PWM" may also be referred to as the "Lnode" signal. The "Lnode" signal is located on a node of an inductor that is either driven low or high by one or more power Field Effect Transistors (FETs) making up a part of a DC-to-DC converter's circuitry.

A challenge is how to change the frequency of a DC-to-DC converter without introducing a charge imbalance. FIG. 2 illustrates an adjusted inductor current resulting from an ideal PWM waveform. The ideal PWM waveform, shown in FIG. 2, and a corresponding flywheel voltage, will provide a constant average current independently of a frequency deviation. A plurality of transitional periods ($T_1$, $T_2$, and $T_3$) may be calculated. Moreover, an output voltage ripple can be reduced to the integral of an inductor ripple current. A first order linear design approach based on inductor current is preferably used to simplify an implementation of a DC-to-DC converter having reduced output voltage ripple.

A transitional period required when switching between a switching frequency Fn and another switching frequency Fn+1 may be defined as:

$$T_{Transitional} = \frac{(T_{F(n)} + T_{F(n+1)}) * (1 - D)}{2}, \quad \text{Eq. 1}$$

where D is the Duty cycle, and $T_{F(n)}+T_{F(n+1)}$ are the periods of the two frequencies Fn and Fn+1.

Equation 1 above may appear to be an over-simplification, but the generation of a PWM signal is as simple as comparing an error signal with a ramp using a voltage comparator. A fast dithering method of generating a PWM switching signal that allows the PWM switching signal to be changed every cycle without introducing a significant output ripple voltage is disclosed in co-pending patent application Ser. No. 11/756,909, now U.S. Pat. No. 7,928,712, filed Jun. 1, 2007.

Spurious RF transmissions due to leakage of DC-to-DC converter switching noise into a mobile phone's transmitter circuitry may be reduced somewhat by a fast dithering of a DC-to-DC converter's switching signal. The fast dithering of a switching signal is a two-dimensional process that spreads a plurality of switching frequency spurs over a wide range while improving output voltage ripple rejection. While fast dithering of a switching signal provides good a design starting point it has been discovered that every data burst (FIG. 3) from a Global System for Mobile communication (GSM) mobile phone will have very similar signatures. As a result, fast dithering may result in a poor quality communications link as explained below.

In GSM, the quality of the link is measured in terms of bit error rate (BER) and a frame erasure rate (FER) for various traffic and control channels. Fast dithering affects a quality of service (QoS) for a mobile phone in at least two ways. For one, the quality of audio carried in audio channel will deteriorate from a tone produced by periodic switching noise generated by a mobile phone's DC-to-DC converter having a switching signal undergoing fast dithering. Secondly, a call in progress via a mobile phone may be dropped due to a repeated corruption of a slow control channel word or byte due to EMI from switching noise generated by a mobile phone's DC-to-DC converter having a switching signal undergoing fast dithering.

An examination of information carried over a GSM network is helpful in evaluating other negative impacts of a fast dithering of a DC-to-DC converter's switching signal. FIG. 3 depicts a GSM Frame with Burst structures. There eight bursts in a GSM frame of a mobile phone call. One burst is used for reception and another burst is used for transmission. The remaining bursts may be used to by a mobile phone controller to monitor an adjacent cell's signal power along with other information in case a handover of a call is needed. A normal burst typically includes a traffic channel that can carry audio and/or other types of data including control information.

In a case involving audio data, the audio data is segmented into 20 ms segments and is usually encoded using a Regular-Pulse-Excited-Linear-Predictive-Coder (RPELCPC). Each of the 20 ms segments generates 260 coded bits, which are classified in three groups known as group 1a, group 1b and group II. Based on subjective testing, the three groups exhibit significant variations in sensitivity to errors. Errors within the first 50 coded bits in group 1a cannot be tolerated, whereas the coded bits of group II can tolerate some errors. However, the coded bits of group II are relatively tolerant to errors.

A low signal to noise ratio or poor link quality due to EMI from switching noise generated by a mobile phone's DC-to-DC converter having a switching signal undergoing fast dithering will introduce errors into the coded bits of groups 1a, 1b and II. Individual errors in the coded bits may be corrected by a decoding process, but blocks of errors in coded bits of groups 1a, 1b and II are relatively harder to correct. If any of the group 1a coded bits remain incorrect after the decoding process a frame erasure is likely to occur. As a result of multiple frame erasures, a higher than acceptable BER and/or FER will result in unacceptable poor audio quality, slow data rates, dropped calls and failures to respond to paging. Moreover, other mobile phones in their respective downlinks will be negatively affected by a mobile phone having a DC-to-DC converter with a switching signal undergoing fast dithering. Thus, it may be tempting to try a slow dither the switching signal of a DC-to-DC converter. However, experience has shown that whereas a fast dither of a switching signal results in an increase in BER relative to FER, a slow dither of a switching signal results in an increase in FER over BER. Thus, there remains a need to provide switching signal dithering circuit and method for a switching power supply such as a DC-to-DC converter for a mobile phone that will yield a low voltage ripple while reducing EMI and RF spurious transmissions. Moreover, there is a need for a switching signal dithering circuit and method that will result in less stringent filtering requirements, reduced cost, and increased efficiency for switching power supplies.

SUMMARY OF THE DISCLOSURE

In order to meet the various 3rd Generation Partnership Project (3Gpp) requirements that relates to spurious emissions and noise, the switching frequency of the DC-to-DC converter which gets modulated onto the RF carrier must be spread over a certain bandwidth that is actually much wider than a communications measurement's bandwidth. Modeling and measurements have revealed that a superior ripple spreading could be achieved if another dimension beyond a two dimensional fast dither of a switching signal for a switching power supply is added. The added dimension of the present disclosure takes advantage of measurement averaging whenever possible. Such an advantage is especially desirable in GSM standards testing. This added third dimension provides a slower changing aspect to the fast dithered spectrum. An ultimate result of the third dimension is a greater ripple suppression in receive (RX) mobile phone bands and other areas of concern where averaging is used for communications measurements.

A circuit of the present disclosure includes a switching circuitry adapted to transfer energy from a source to a load using a switching signal having a series of switching cycles and a switching frequency. Also included is a control circuitry that provides another dimension to the two dimensional fast dither by being adapted to generate a pseudo-random value near a beginning of each of the series of switching cycles to determine a maximum switching frequency value based upon the pseudo-random value. A disclosed method includes adjusting the switching frequency of the switching signal incrementally from a minimum switching frequency value to the maximum frequency value and vice versa as a function of time during each of the series of switching cycles of the switching circuit.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

FIG. 8 is a logic truth table for the address decoder of the dithering and frequency control function of FIG. 7.

FIG. 10 is a decoder truth table for the control for controlling the MLSR pseudo random number generator of FIG. 9.

FIG. 11 is a table of expected decimal values for various pseudo-random word selections for that may be generated by the MLSR of FIG. 9.

DETAILED DESCRIPTION

The embodiments set forth below represent the necessary information to enable those skilled in the art to practice embodiments of the disclosure and illustrate the best mode of practicing the principles of the disclosure. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

In order to meet the various 3Gpp requirements that relates to spurious emissions and noise, the switching frequency of the DC-to-DC converter which gets modulated onto the RF carrier must be spread over a certain bandwidth that is much wider than a communications measurement's bandwidth. Modeling and measurements have revealed that a superior ripple spreading could be achieved if another dimension was added to a fast dithering method. This added dimension would provide a slower changing aspect to the fast dithered spectrum. As a result, there is greater ripple suppression in the RX bands and other areas of concern where averaging is used for communications measurements.

Adding a third dimension to fast dithering will allow less stringent filtering requirements and thus simplify designs for switching power supplies for mobile phones, while at the same time reduce the cost, and increase efficiency of such designs. Moreover, such a design approach in accordance with the present disclosure is useable to design switching power supplies such as DC-to-DC converters that deliver DC power to single and multi-mode radio frequency (RF) power amplifiers (PAs). Moreover, such a design approach incorporating three-dimensional (3D) frequency dithering is also advantageous for applications other than powering RF PAs. For example, RF transceivers having a Voltage Controlled Oscillator (VCO) and Phase-Locked Loop (PLL) used to generate an RF carrier exhibit very high gain with extreme sensitivity to noise and power supply ripple. Thus, RF transceivers having VCOs and PLLs will benefit from the 3D frequency dithering provided by the present disclosure.

Figure 4:
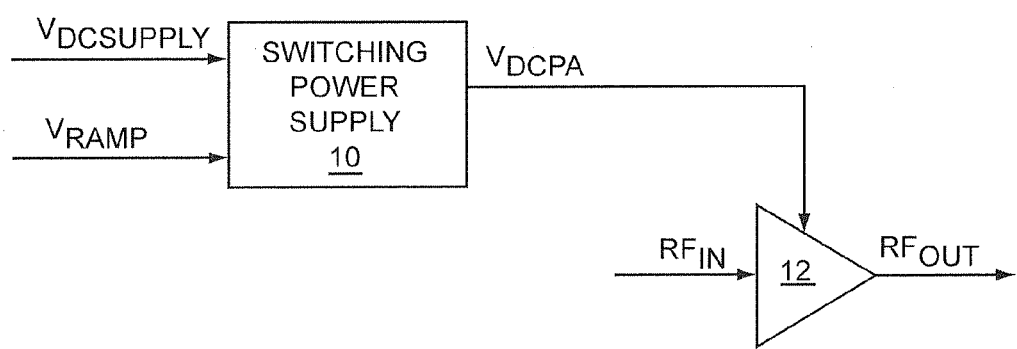
FIG. 4 depicts a switching power supply useable to transfer power from a source to a radio frequency (RF) power amplifier (PA), according to one embodiment of the disclosure.

In accordance with the present disclosure, FIG. 4 shows a switching power supply 10 for transferring power to a radio frequency power amplifier (RF PA) 12. The switching power supply 10 receives a direct current (DC) supply signal $V_{DCSUPPLY}$ and a set point signal $V_{RAMP}$, and provides a direct current signal $V_{DCPA}$ to a power supply input to the RF PA 12. The switching power supply 10 regulates direct current signal $V_{DCPA}$ based on the set point signal $V_{RAMP}$. The RF PA 12 receives and amplifies an RF input signal $RF_{IN}$ to provide an RF output signal $RF_{OUT}$ using the direct current signal $V_{DCPA}$.

A two dimensional fast dithering method for generating a pulse width modulation (PWM) signal that provides for a switching frequency adjustment at every cycle is disclosed in U.S. patent application Ser. No. 11/756,909, now U.S. Pat. No. 7,928,712. The present disclosure improves the fast dithering method, whereby a minimum frequency and a maximum frequency used for the lower and upper limits of the fast dithering are changed at a slower rate than an averaging rate of a communication test measurement. The slower rate can either be changed continuously or on a per burst basis. The slower rate actually takes advantage of the fact that, for GSM, the measurement setup averages between 50 and 200 bursts (FIG. 3) depending on a particular GSM test being performed. As long as the slow dithering rate is actually slower than the averaging rate of the GSM test measurement, a significant ripple suppression gain can be added to the fast dithering gain.

Implementing fast dithering based on randomly selecting a frequency within a range of uniformly distributed frequencies would also get a noise-like spreading gain. However, since an inductor charge imbalance is proportional to a step in frequency, an average step would have a mean close to the maximum number of frequencies/2, and thus will have a larger mean ripple. Furthermore, this approach would not benefit as much from the averaging process which can add an extra 10 dB to 15 dB or so of rejection.

Fast dithering is a two-dimensional process which spreads the switching frequency spurs over a wider range, which results in some ripple rejection. However, every burst (FIG. 3) in a GSM frame will look very similar to each other. If every burst had a different signature, a resulting average would provide more ripple rejection above and beyond the gain of using fast dithering alone.

The fast dithering signature of the bursts of a GSM frame can be changed by providing upper frequency limits and/or different lower frequency limits from time to time or for every burst. Randomly changing the upper and lower frequency limits of a switching signal is one aspect of three-dimensional fast dithering of a switching signal for a switching power supply.

Figure 5A:
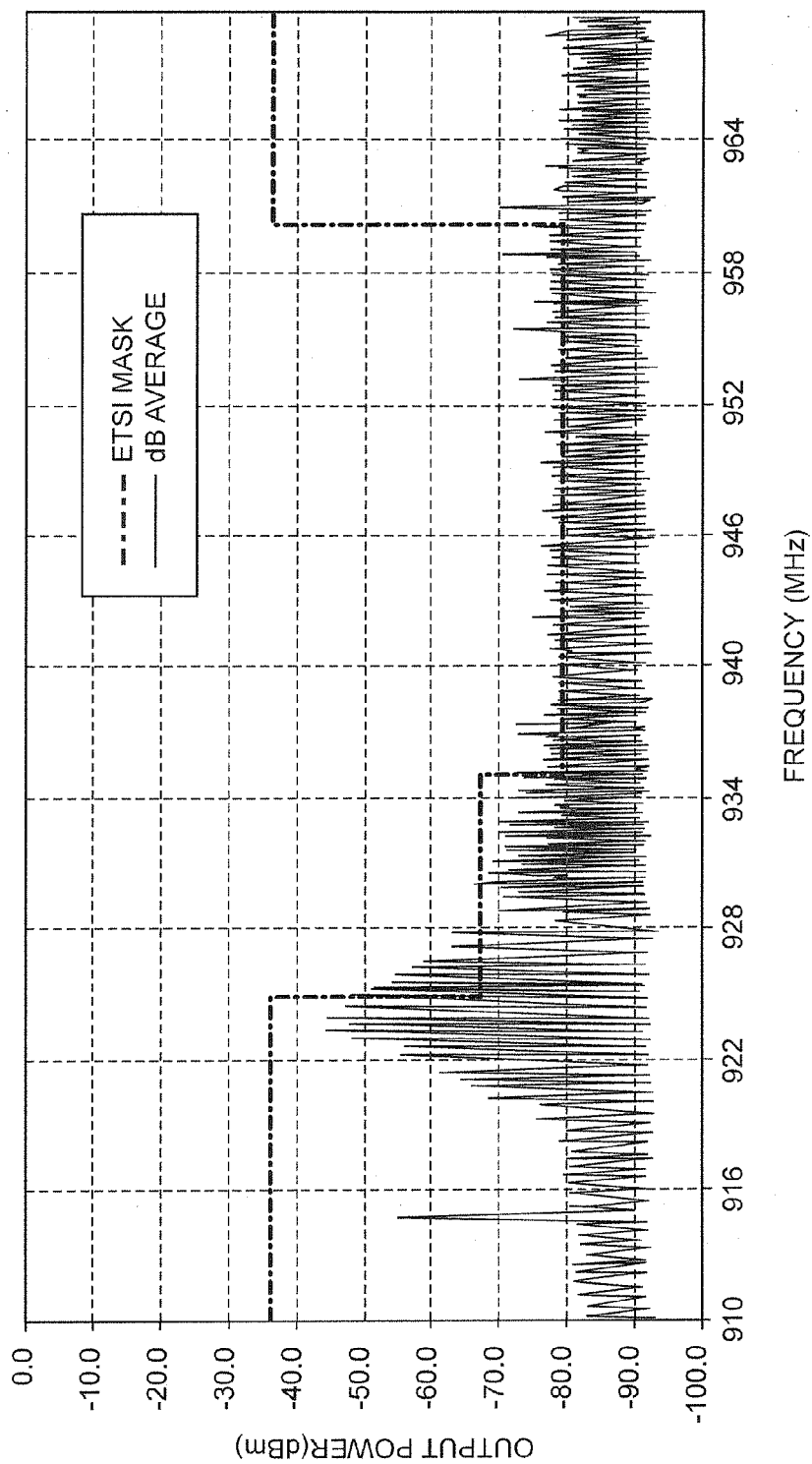
FIGS. 5A and 5B illustrate the impacts of three-dimensional fast dithering.
Figure 5B:
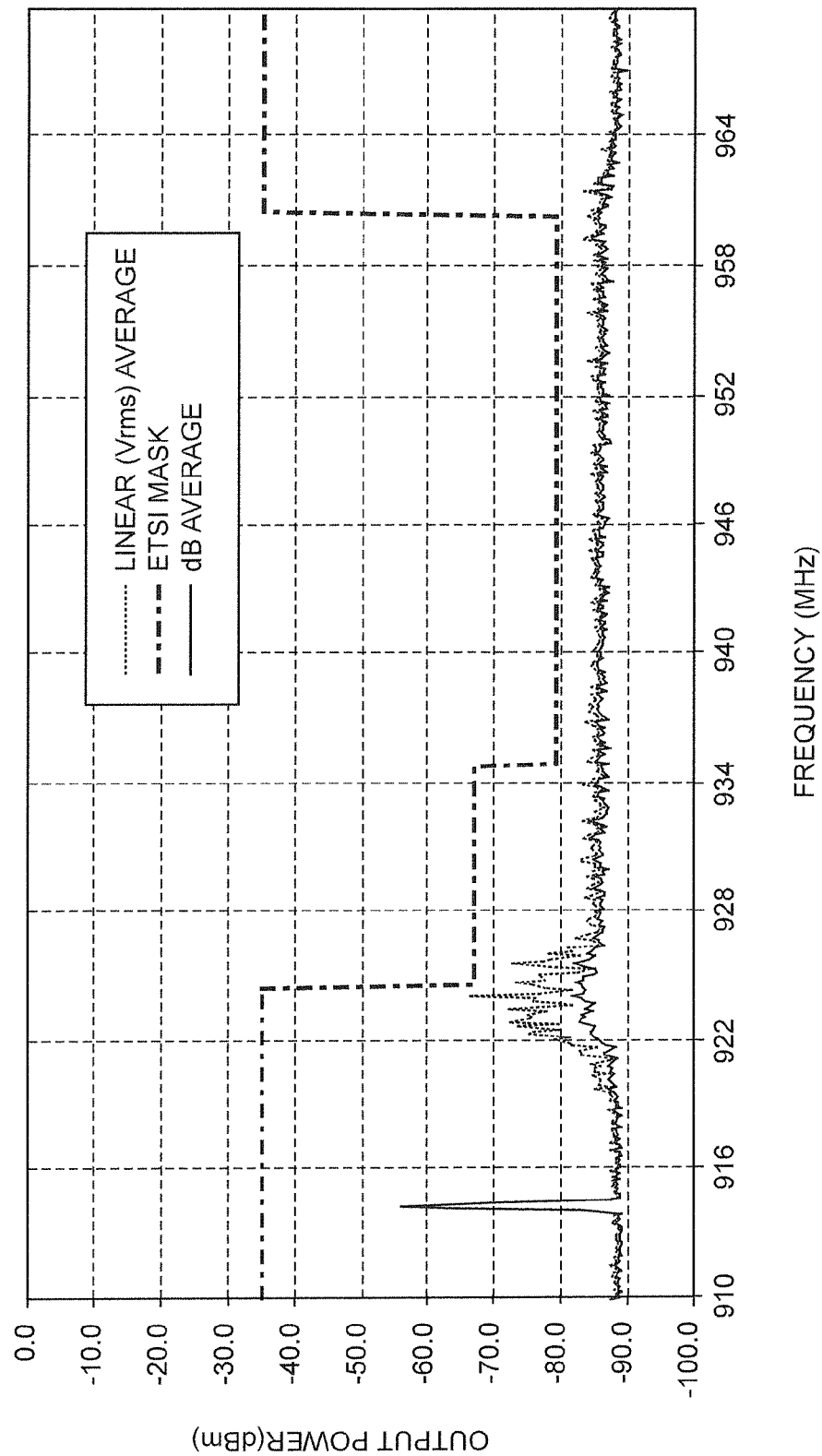

FIGS. 5A and 5B illustrate the impacts of the three-dimensional fast dithering of a switching power supply's switching signal. FIG. 5A shows a graph of fifty GSM bursts using two-dimensional fast dithering with a two stage output filter. An overlay of a European Telecommunications Standards Institute (ETSI) spectral mask in a Low GSM band shows a marginal passing of the ETSI standards at best. FIG. 5B shows a graph of a linear average of fifty GSM bursts using three-dimensional fast dithering in which a maximum switching frequency limit and/or a minimum switching frequency limit is randomly changed. As a result of changing the maximum and/or minimum switching frequency limits while using fast frequency dithering, an averaging effect inherent in the ETSI measurement yields a conclusive passing of the ETSI test standard.

Five types of switching frequency dithering are supported by the present disclosure. Four of the switching frequency dithering types are two-dimensional and a fifth is three-dimensional. Two of the two dimensional dithering types are slow and two others are fast. A stepping sequence from a minimum switching frequency limit to a maximum switching frequency limit can either follow an incremental relationship, or be purely random or preferably be pseudo-random. An incremental stepping sequence is preferably linear.

Figure 6:
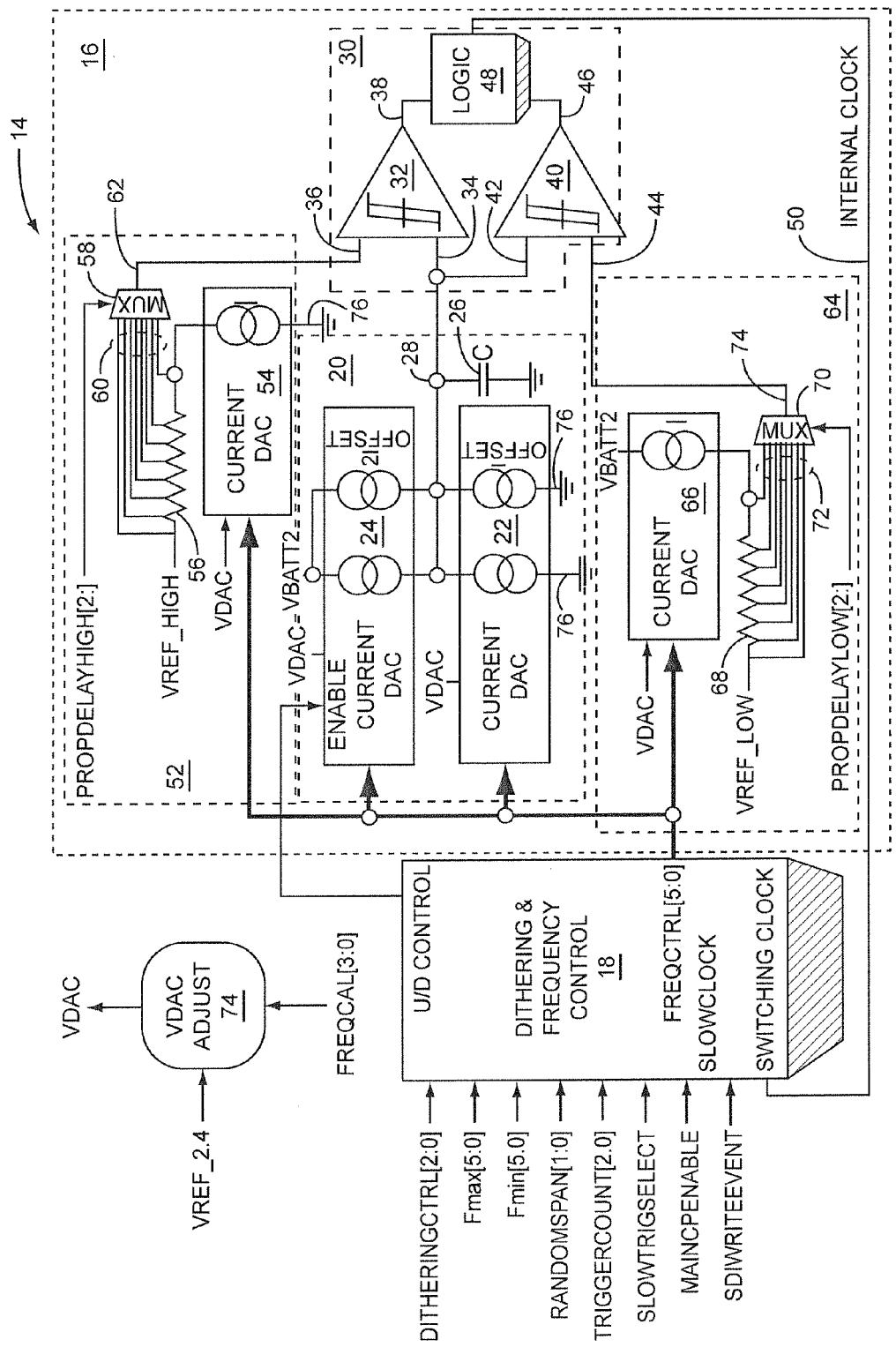
FIG. 6 is a block diagram of a circuit that is useable to generate the five types switching frequency dithering supported by the present disclosure.

FIG. 6 depicts a block diagram of a circuit 14 that is an embodiment of the present disclosure that is useable to generate the five types switching frequency dithering supported by the present disclosure. The circuit 14 includes a frequency generator 16 and a dithering and frequency control function 18 that are useable to set a desired frequency dithering configuration for a switching signal of the switching power supply 10 (FIG. 4). The frequency generator 16 includes a variable slope ramp generator 20 for generating a triangular waveform having an increasing voltage section and a decreasing voltage section. The variable slope ramp generator 20 comprises a discharging digital-to-analog converter (DAC) 22 and a charging DAC 24 that are useable to discharge and charge an on-chip capacitor 26. The discharging DAC 22 is always active and provides a negative sloped voltage ramp for generating the decreasing voltage section of the triangular waveform. The charging DAC 24 is enabled to provide a positive sloped voltage ramp for generating the increasing voltage section of the triangular waveform by supplying more current than the discharging DAC 22. Both, the discharging DAC 22 and the charging DAC 24 are each programmable to deliver variable amounts of current. In a preferred embodiment the charging DAC 24 is programmed to supply twice as much current as the discharging DAC 22. The triangular waveform is available at an output node 28 during operation of the variable slope ramp generator 20.

A window comparator 30 includes a first voltage comparator 32 having an input 34, a threshold voltage input 36 and an output 38. The window comparator 30 also includes a second voltage comparator 40 having an input 42, a threshold voltage input 44 and an output 46. The input 34 of the first voltage comparator 32 and the input 42 of the second voltage comparator 40 are coupled to the output node 28 of the variable slope ramp generator 20. The output 38 of the first voltage comparator 32 and the output 46 of the second voltage comparator 40 are coupled to a logic circuit 48.

During operation of the variable slope ramp generator 20, the first voltage comparator 32 compares the triangular waveform at the input 34 to an adjustable reference voltage (VREF_HIGH) provided to the threshold voltage input 36. A responsive output signal is generated by the first voltage comparator 32 and presented at the output 38. In similar fashion, the second voltage comparator 40 compares the triangular waveform at the input 42 to an adjustable reference voltage (VREF_LOW) provided at the threshold voltage input 44. A responsive output signal is generated by the second voltage comparator 40 and presented at the output 46. The logic circuit 48 generates an internal clock signal 50 in response to the output signals provided by the first voltage comparator 32 and the second voltage comparator 40.

The adjustable reference voltages VREF_HIGH and VREF_LOW are useable to provide a selectable propagation delay compensation for the first voltage comparator 32 and the second voltage comparator 40, respectively. If no propagation delay compensation is selected, the VREF_HIGH and VREF_LOW thresholds are not adjusted with a change in frequency for a switching signal. However, when propagation delay compensation is selected, the VREF_HIGH and VREF_LOW thresholds are adjusted as the frequency of the switching frequency is changed.

It is preferred that a propagation delay compensation be provided to maintain linearity between generated switching frequencies and a set of generated pseudo-random codes. In this way, the frequency generation for the set of generated random codes can be accurately predicted. The propagation delay compensation also makes predicting a spur spreading gain more accurate. At least one reason the propagation delay compensation is preferred is that as frequency increases a finite comparator propagation becomes a more important portion of the frequency's total period. As a result, the frequency is reduced by an equal amount as the frequency increases.

A propagation delay compensation circuitry 52 that is useable to adjust the VREF_HIGH threshold comprises a current DAC 54 that is coupled to a multi-tap resistor 56. An adjustable current controlled by the current DAC 54 flows through the multi-tap resistor 56 to generate the adjustable VREF_HIGH threshold. An analog multiplexer (MUX) 58 receives inputs from taps 60 of the multi-tap resistor 56. The MUX 58 has an output 62 that is coupled to the voltage threshold input 36 of the first voltage comparator 32. A control signal PROPDELAYHIGH[2:] is useable to select Individual ones of taps 60 for output to the voltage threshold input 36 of the first voltage comparator 32.

Another propagation delay compensation circuitry 64 that is useable to adjust the VREF_LOW threshold comprises a current DAC 66 that is coupled to a multi-tap resistor 68. An adjustable current controlled by the current DAC 66 flows through the multi-tap resistor 68 to generate the adjustable VREF_LOW threshold. An analog multiplexer (MUX) 70 receives inputs from taps 72 of the multi-tap resistor 68. The MUX 70 has an output 74 that is coupled to the voltage threshold input 44 of the second voltage comparator 40. A control signal PROPDELAYLOW[2:] is useable to select Individual ones of taps 72 for output to the voltage threshold input 44 of the second voltage comparator 40. The independent control PROPDELAYLOW[2:] is provided for propagation compensation circuitry 64 because the second voltage comparator 40 operates closer to ground potential 76 and will behave differently than the first voltage comparator 32. An adjustable voltage reference 74 having a voltage reference input (VREF_2.4) and a control input (FREQCAL[3:0]) is useable to supply the current DACs 22, 24, 54 and 66 with an accurate voltage reference (VDAC).

Figure 7:
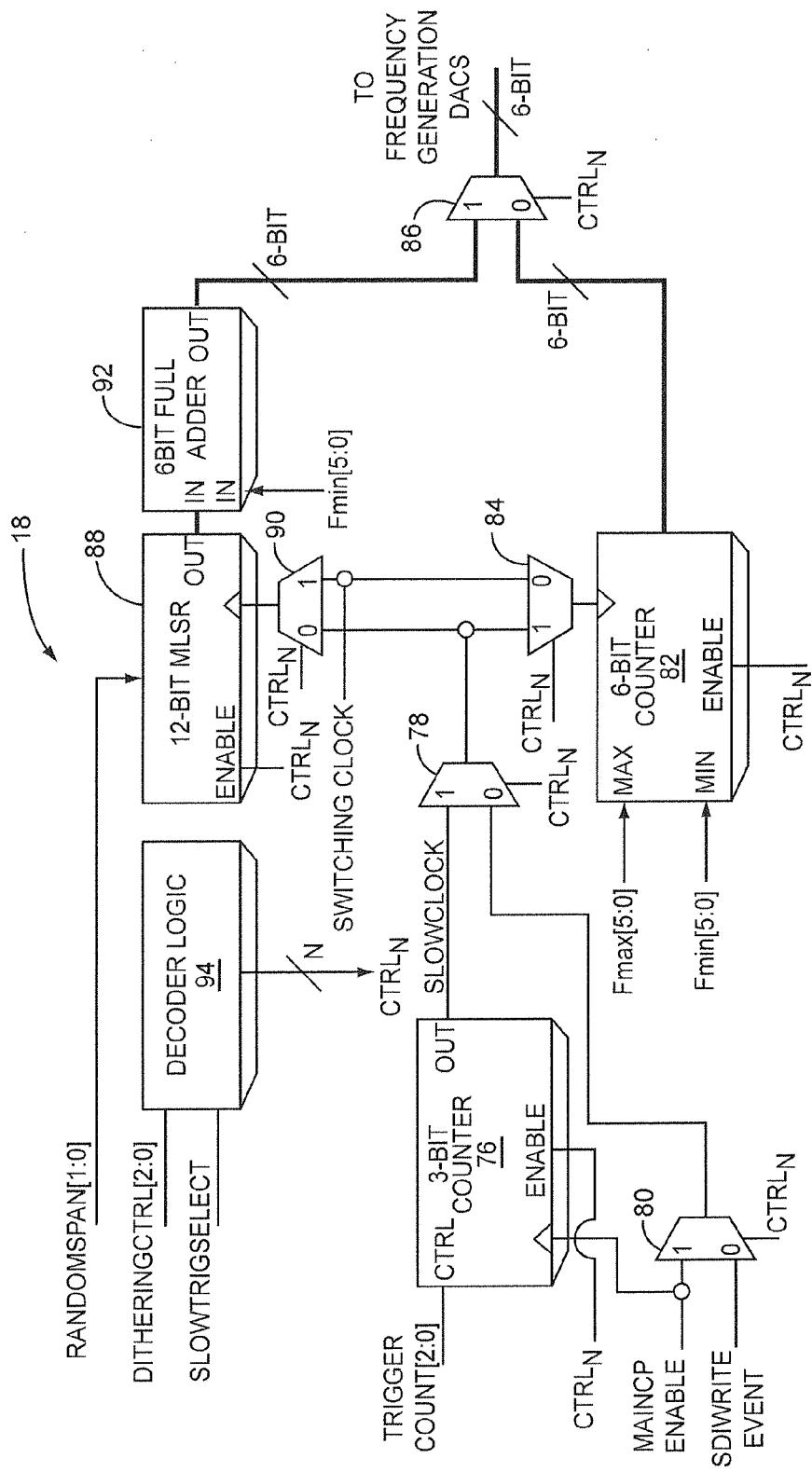
FIG. 7 is a block diagram of a sub-circuit that is useable to provide the dithering and frequency control function of the circuit shown in FIG. 6.

FIG. 7 shows details of the dithering and frequency control function 18 depicted in FIG. 6. The frequency control function includes a 3-bit counter 76 that generates a SLOWCLOCK signal that is input for a digital multiplexer (DMUX) 78. A DMUX 80 receives an enable signal (MAINCP ENABLE) and an event signal (SDIWRITE EVENT). The SDIWRITE EVENT signal is generated upon a Serial Device Interface (SDI) write event that is useable to preset values of registers and counters such as the 3-bit counter 76. Either the enable signal or the event signal is selected as output for input into the DMUX 78 via a control signal (CTRL$_N$). The DMUX 78 is controlled by the CTRL$_N$ signal, which is useable to select either the output from DMUX 80 or the SLOWCLOCK signal for output. A 6-bit counter 82 includes a clock input that is fed by a either the SLOWCLOCK signal or a SWITCHING CLOCK signal that is selectable through a DMUX 84. A 6-bit output from the 6-bit counter 82 is input for a DMUX 86. A Maximum Length Shift Register (MLSR) 88 that is useable to generate pseudo-random numbers accepts input from a DMUX 90. The CTRL$_N$ signal is received by the DMUX 90 to select between the SLOWCLOCK signal, the SWITCHING CLOCK signal, the MAINCP ENABLE signal and the SDIWRITE EVENT signal. A 6-bit adder 92 receives random numbers generated by the MLSR 88. The 6-bit adder 92 adds the random numbers to Fmin values inputted into the 6-bit adder via an Fmin[5:0] signal. Individual summations of the random numbers and Fmin values are passed to the frequency generator 16 (FIG. 6) as a 6-bit word via the DMUX 86.

A decoder logic circuit 94 receives and decodes control bits sent via a DITHERINGCTRL[2:0] signal. The decoded control bits are useable to control or enable the 3-bit counter 76, the 6-bit counter 82, and the MLSR 88. FIG. 8 is a truth table that relates the various dithering modes of slow, fast, linear, and random to the dithering control settings carried by the DITHERINGCTRL[2:0] signal.

Figure 9:
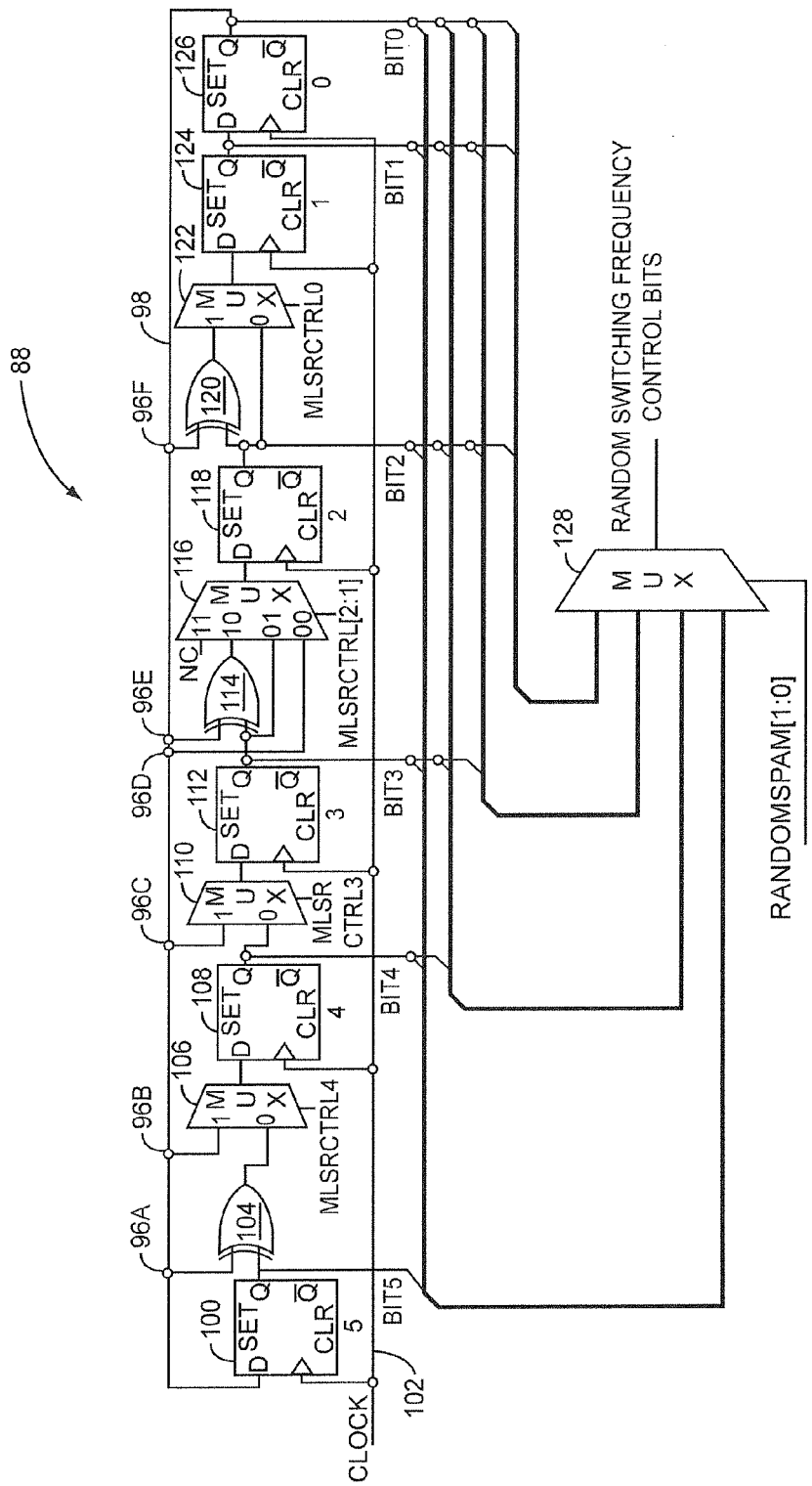
FIG. 9 is a block diagram of a Maximum Length Shift Register (MLSR) pseudo-random number generator having a variable length control.

FIG. 9 shows the details of the MLSR 88 of FIG. 7. The MLSR 88 is a digital circuit that periodically generates a set of permutations of binary numbers for a given selection of taps 96A-F for capturing binary levels from a feedback path 98. The binary numbers generated follow a uniform distribution with the exception of an all bits zero condition that prevents a sequence needed for binary number generation. The length of the MLSR 88 is adjustable to match the RandomSpan[1:0] selection of 3, 4, 5, or 6 bits. Individual coded selections of taps 96A-F are [2, 1] for a 3-bit length, [3, 2] for a 4-bit length, [4, 2] for a 5-bit length, and [5, 4] for a 6-bit length.

A D flip-flop 100 accepts input from the feedback path 98 and a clock signal 102. An output of the D flip-flop 100 is a most significant bit, and in this case is bit 5. The bit 5 output of D flip-flop 100 is fed into an exclusive or (XOR) gate 104, which also receives input from the tap 96A. A digital multiplexer (DMUX) 106 receives output from the XOR gate 104 as well as the tap 96B. An MLSRCTRL4 signal controls which of the signals received by DMUX 106 is outputted to a D flip-flop 108. An output of the D flip-flop 108 is of a bit 4 magnitude. The bit 4 output of the D flip-flop 108 is fed into a DMUX 110 that also receives input from the tap 96C. An MLSRCTRL3 signal controls which of the signals received by DMUX 110 is outputted to a D flip-flop 112. An output of the D flip-flop 112 is of a bit 3 magnitude. The bit 3 output of the D flip-flop 112 is fed into an XOR gate 114 that also receives input from tap 96E. An output of the XOR gate 114 is fed into a DMUX 116 that also receives input from the tap 96D and the output from the D flip-flop 112. An MLSRCTRL [2:1] signal controls which of the signals received by DMUX 116 is outputted to a D flip-flop 118. An output of the D flip-flop 118 is of a bit 2 magnitude. The bit 2 output of D flip-flop 118 is fed into an XOR gate 120 that also receives input from the tap 96F. An output from the XOR gate 120 is fed into a DMUX 122 that also receives the bit 2 output of D flip-flop 118. An MLSRCTRL0 signal controls which of the signals received by DMUX 122 is outputted to a D flip-flop 122. An output of the D flip-flop 122 is of the bit 1 magnitude. The bit 1 output of D flip-flop 122 is fed into a D flip-flop 126 that has an output of the bit 0 magnitude. The bit 0 output of D flip-flop 126 is outputted to the feedback path 98. A DMUX 128 receives the bit outputs of the D flip-flops 100, 108, 112, 118, 124 and 126. The DMUX 128 is controlled by the RANDOMSPAN[1:0] signal to select which of the bit outputs received by the DMUX 128 will be outputted as random switching frequency control bits. The clock signal 102 going to the D flip-flops 100, 108, 112, 118, 124 and 126 can be disabled to reduce power consumption.

FIG. 10 is a decoder truth table for a conversion of the RANDOMSPAN signal to the MLSRCTRL signal. With a step size of 125 kHz, a 3-bit span covers 875 kHz, a 4-bit span covers 1.875 MHz, a 5-bit span covers 3.857 MHz, and a 6-bit span covers 7.875 MHz. The dithering and frequency control function 18 (FIGS. 6 and 7) is configured to not allow the Fmin value and RandomSpan settings to exceed a binary maximum of 111111b. The reason for this is that the MLSR 88 (FIG. 7) is not allowed to go to all zeros. Therefore, minimum allowable switching frequency will be higher by 125 kHz compared to a disallowed 0b RandomSpan setting.

In order to ensure that the MLSR 88 will always start a sequence at a given point, a seed value is loaded into the MLSR 88. The seed value is preferably 1b and is loaded at power up when a power on reset (POR) for the dithering and frequency function 18 (FIG. 6 and FIG. 7) is triggered.

The two equations that follow can be used to predict the binary values, based on the RandomSpan[1:0] selection, and their decimal equivalent. The actual frequency can then be calculated by summing up the selected Fmin value and generated random number value and multiply the sum by 125 kHz and add 2 MHz. The first equation builds an array of binary values sized by a "Number of Trials" value. A set of "Seed_nBit" values are defined in binary as 001b for the 3 Bit, 0001b for the 4 Bit, etc.

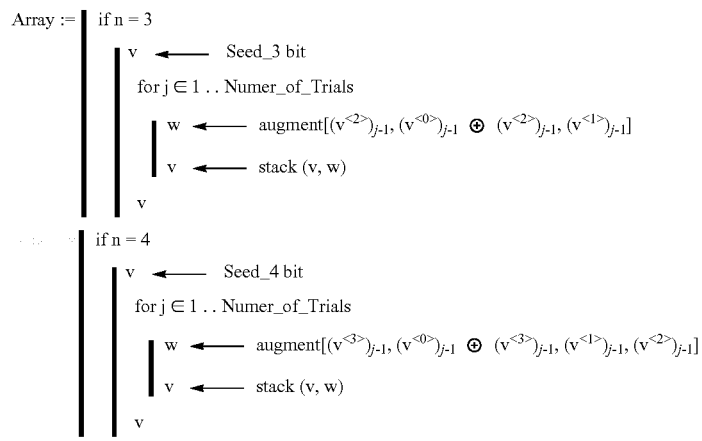

-continued

```
if n = 5
  v ← Seed_5 bit
  for j ∈ 1 .. Numer_of_Trials
    w ← augment[(v^<4>)_{j-1}, (v^<0>)_{j-1}, (v^<1>)_{j-1} ⊕ (v^<4>)_{j-1}, (v^<2>)_{j-1}, (v^<3>)_{j-1}]
    v ← stack (v, w)
  v
if n = 6
  v ← Seed_6 bit
  for j ∈ 1 .. Numer_of_Trials
    w ← augment[(v^<5>)_{j-1}, (v^<0>)_{j-1} ⊕ (v^<5>)_{j-1}, (v^<1>)_{j-1}, (v^<2>)_{j-1}, (v^<3>)_{j-1}, (v^<4>)_{j-1}]
    v ← stack (v, w)
  v
```

FIG. 11 is a table that lists the expected decimal values generated by the MLSR 88. The pseudo-randomness of the expected values is provided by the MLSR 88. A uniform pseudo-randomness is generated for all selectable sequence lengths. Implementations of the various dithering modes are described below.

Linear Fast Dithering

Figure 12:
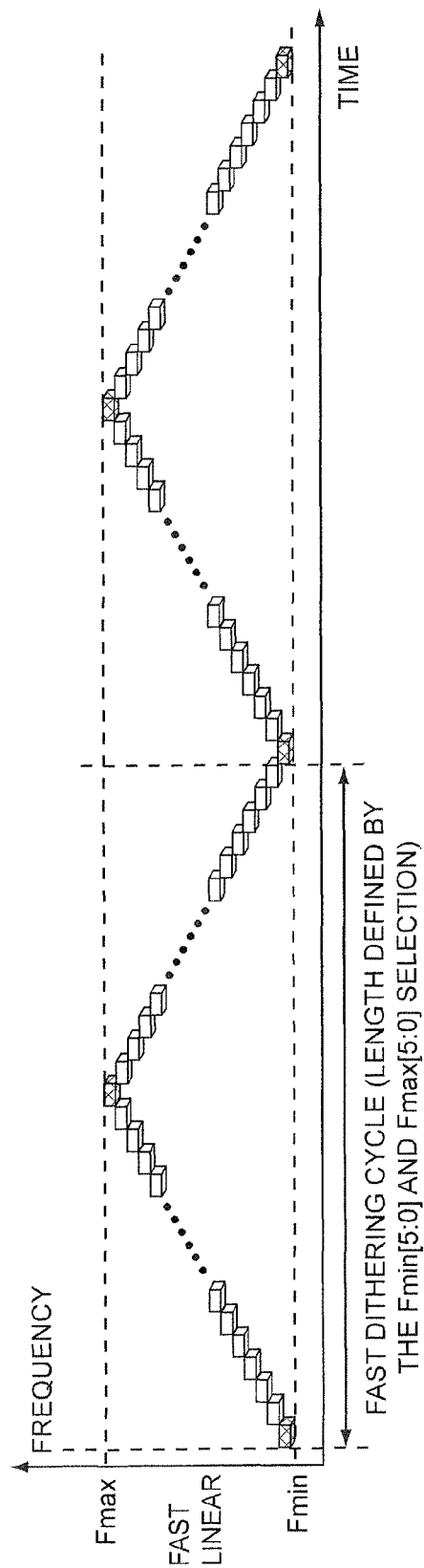
FIG. 12 is a graph of a fast frequency dithering according to the present disclosure.

Referring to FIG. 12, a switching frequency of a switching power supply such as switching power supply 10 (FIG. 4) is changed every switching cycle between the Fmin value and Fmax value. A possible implementation of a method to provide fast dithering may be based on a pre-settable 6-bit up/down counter such as the 6-bit counter 82 (FIG. 7). In such a case, the value of the Fmin[5:0] signal is used as a preset frequency value for a lower frequency limit, and the value Fmax[5:0] signal is used as a preset frequency value for an upper frequency limit. The 6-bit counter 82 will count up or down incrementally between the Fmin and Fmax values. As a result of a repetitive cycle incrementing and decrementing between the Fmin and Fmax values, a plurality of discrete frequency tones will be generated. The spectral spacing between each of the plurality of tones is equal to the dithering frequency. The plurality of discrete frequency tones will extend all to way to zero frequency (i.e., DC), so the amplitude of each tone's fundamental frequency along with any significant harmonics is an important design consideration. The resulting dithering frequency is calculated as follows:

$$F_{Dithering} = \frac{1}{\frac{1}{F\min} + \frac{1}{F\max} + 2\sum_{n=1}^{N-1} \frac{1}{F\min + nF_{steps}}}$$

where N is the number of steps between Fmin and Fmax ((Fmax−Fmin)/$F_{steps}$), and $F_{steps}$ is a step size such as 125 kHz.

Random Fast Dithering

Figure 13:
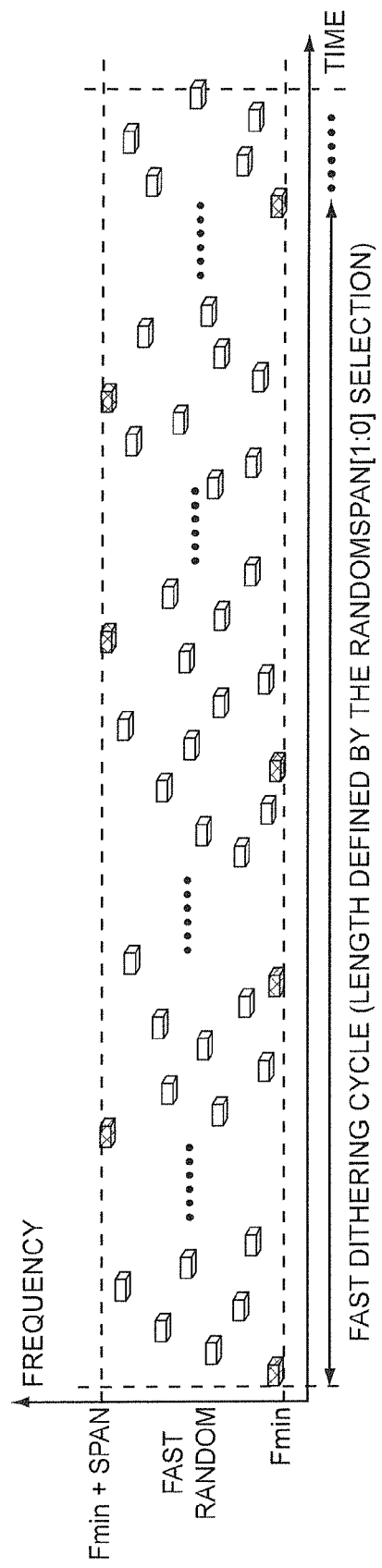
FIG. 13 is a graph of a fast frequency dithering including a random span according to the present disclosure.

Referring to FIG. 13, the frequency of the switching power supply 10 (FIG. 4) is again changed every switching cycle, but in a random fashion. In this case the 6-bit up/down counter is replaced by the maximum length shift register (MLSR) 88 (FIGS. 6 and 7) and the 6-bit full adder 92. At near the beginning of every switching cycle of the switching frequency, a new random number will be generated by the MLSR 88, which is controlled by the bits of the RandomSpan [1:0] signal. The new random number is then added to the Fmin value, and the sum is passed to the frequency generator 16 (FIG. 6) as a 6-bit word.

Linear Slow Dithering

Figure 1:
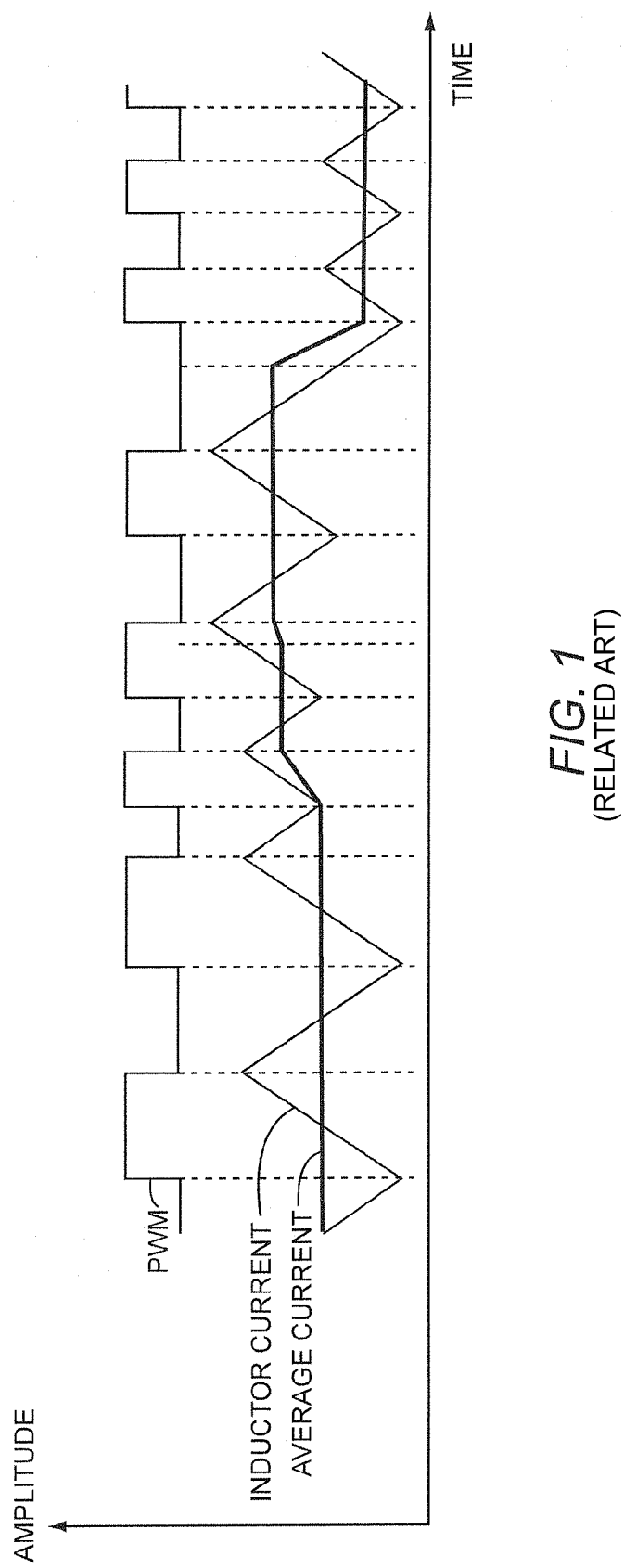
FIG. 1 depicts an inductor current imbalance as a pulse width modulated (PWM) switching frequency is stepped from one period to another.
Figure 2:
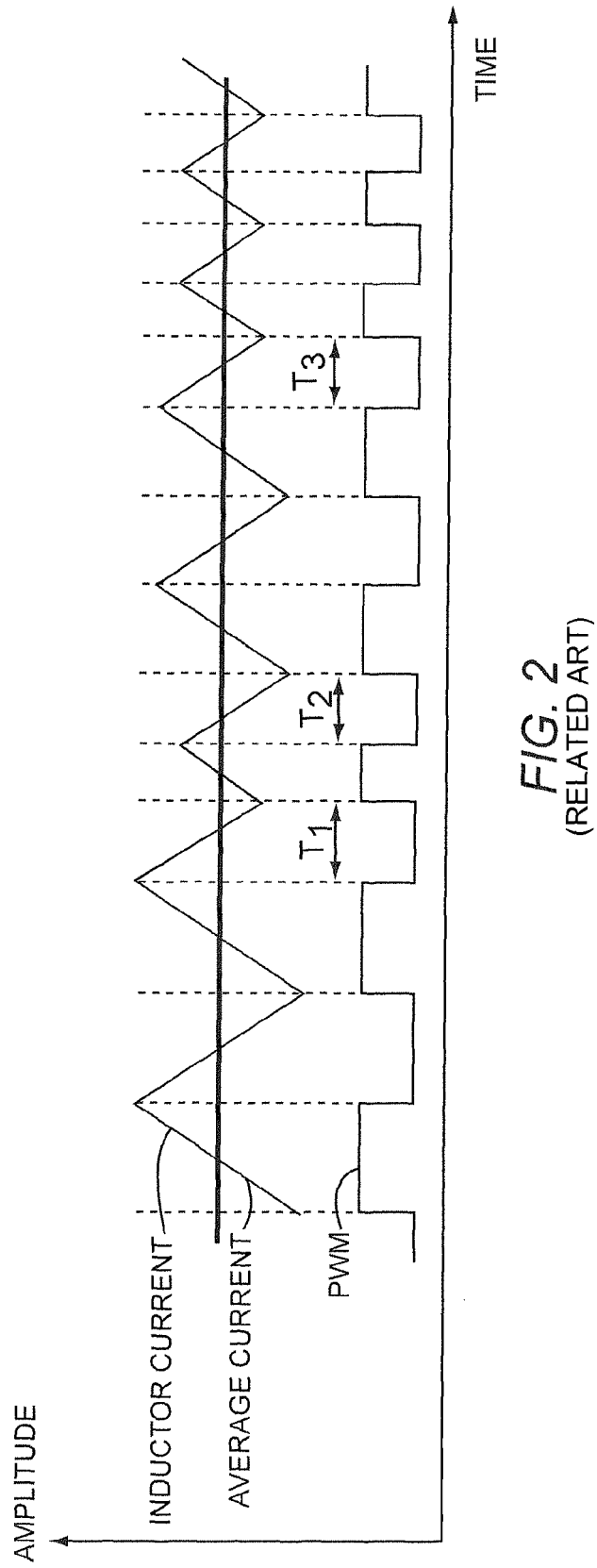
FIG. 2 depicts an adjusted inductor current resulting from an ideal PWM waveform.
Figure 3:
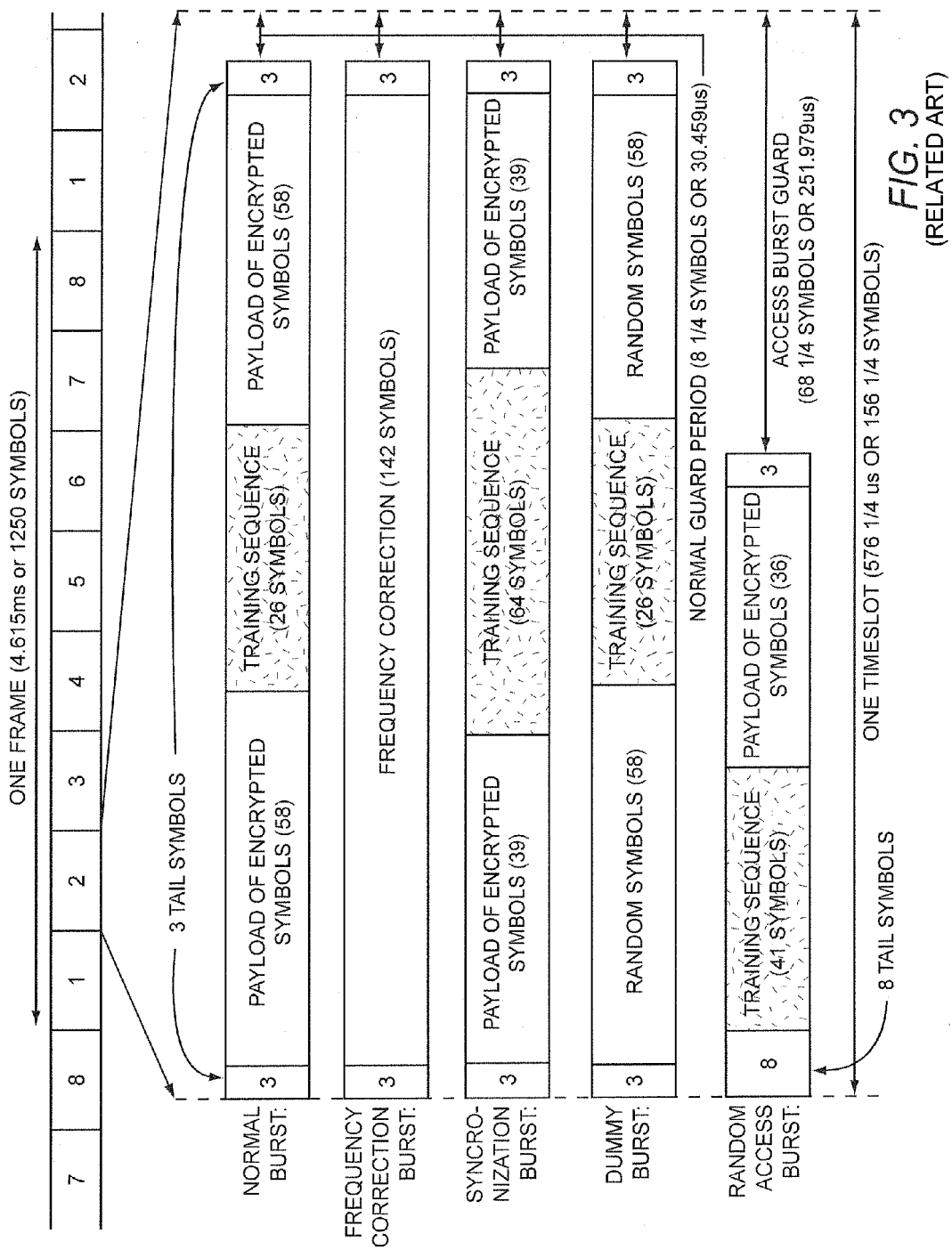
FIG. 3 depicts a GSM Frame with Burst structures.
Figure 14:
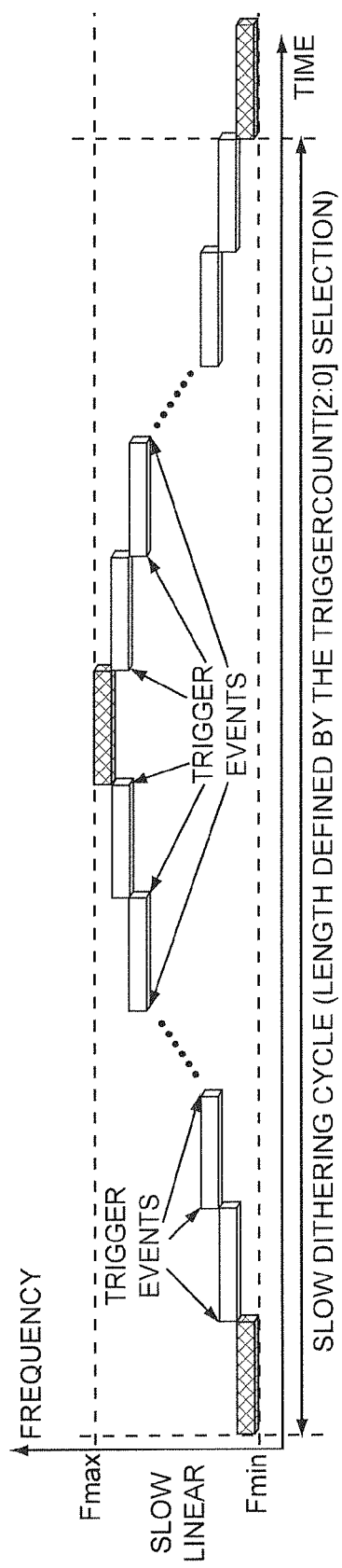
FIG. 14 is a graph of a slow frequency dithering according to the present disclosure.

Referring to FIGS. 6 and 14, the frequency of the switching power supply 10 (FIG. 4) is changed when a trigger event occurs. One trigger event occurs on a rising edge of the MainCpEnable bit. Another trigger event occurs on the completion of a Serial Device Interface (SDI) write cycle. Either of these trigger events can be selected with the bit SlowTrigSelect[1:0]. A possible implementation can a based on a pre-settable 6-bit up/down counter, where Fmin is used as preset value, and Fmax is used as the upper limit. The counter will count up or down incrementally between Fmin and Fmax. Furthermore, in case the time lapse between successive events is too short, a trigger event counter allows that time to be extended. The number of trigger events to be counted depends on the TriggerCount[2:0] bits which allow 1, 2, 4, 8, 16, 32, 64, or 128 events to be counted. The dithering rate, if it exists, can also be calculated as in the Linear Fast Dithering by taking into account the rate of occurrence of the selected trigger event and the number of it that are being counted as per the TriggerCount[2:0] bits. In practice, the dithering rate will most likely be at very low frequency that is significantly below the audible range of humans and will only exist if the dithering rate is changed repetitively within one burst (FIG. 3).

Random Slow Dithering

Figure 15:
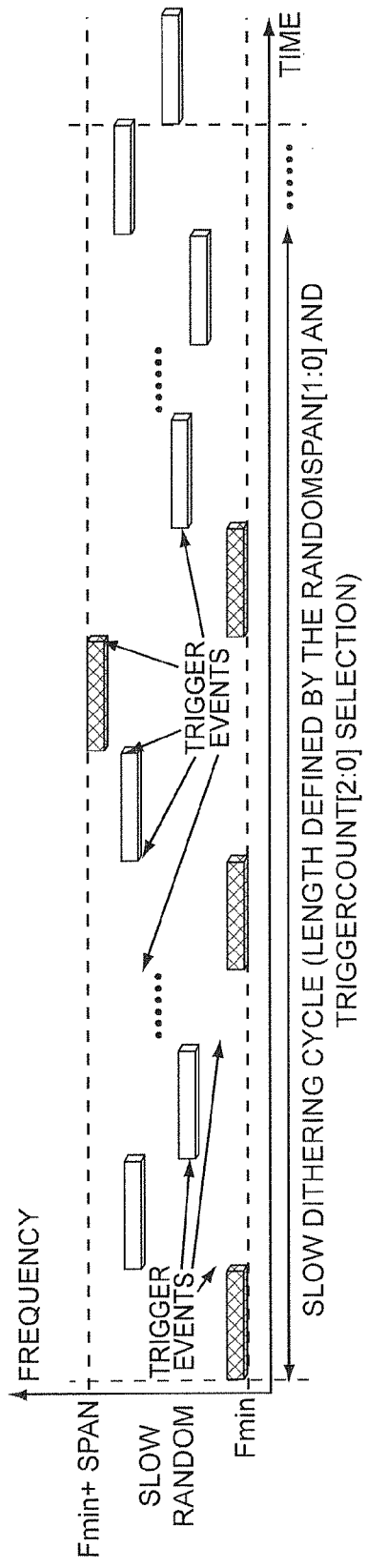
FIG. 15 is a graph of a slow frequency dithering including a random span according to the present disclosure.

Referring to FIG. 15, the frequency of the switching power supply 10 (FIG. 4) is again changed every so often when the so-called trigger events occur, but in a random fashion. In this case, the operation of the 6-bit counter 82 (FIG. 7) is replaced by an operation of the MLSR 88 (FIG. 7) and the 6-bit full adder 92 (FIG. 7). Every switching cycle, a new random number will be generated by the MLSR 88 as controlled by bits sent via the RandomSpan[1:0] signal. The generated random number is then added to the Fmin value. The sum is passed to the frequency generator 16 as a 6-bit word. There are two events being supported at this time and they are; a rising edge of the MainCpEnable bit, and the completion of an SDI write cycle. Either one can be selected with a bit use a SlowTrigSelect[1:0] signal. Furthermore, in case the time lapse between successive events is too short, a trigger event counter allows that time to be extended. The number of trigger events to be counted depends on the TriggerCount[2:0] bits which allows 1, 2, 4, 8, 16, 32, 64, or 128 events to be counted (only valid for the SDI write events). In practice, the dithering rate will most likely be at very low frequency that is significantly below the human audible range and will only exist if it is changed repetitively within each burst.

3D Dithering

Figure 16:
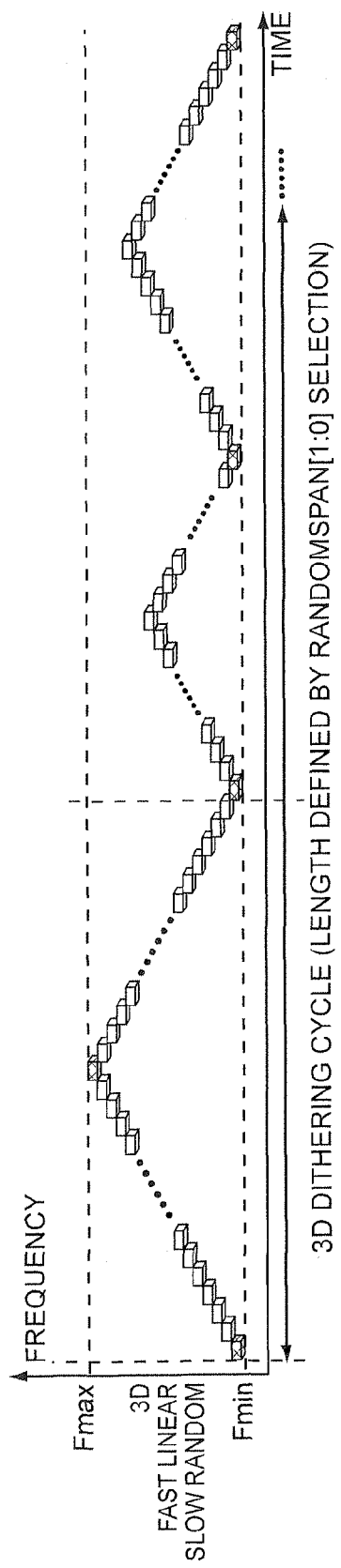
FIG. 16 is a graph of a three dimensional frequency that has a random maximum frequency according to the present disclosure.

Referring to FIG. 16, the frequency of the switching power supply 10 (FIG. 4) is again changed every switching similar to fast frequency dithering, but in this case the maximum frequency value Fmax is changed randomly while the minimum frequency value Fmin is fixed. However, the Fmin value may be changed via the SDI. In operation, the 6-bit counter 82 (FIG. 7) begins incrementing from the Fmin value and continues for every switching cycle until the first Fmin+random value is reached, after which the 6-bit counter 82 decrements towards the Fmin value. Upon reaching the Fmin value, the MLSR 88 is incremented once, and the new random number is again added to the Fmin value. The 6-bit counter 82 counts up incrementally until it reaches the Fmax value, after which the 6-bit counter 82 decrements towards the Fmin value. The only bits used to control three-dimensional frequency dithering bits sent by the Fmin[5:0] and RandomSpan[1:0] signals. In this case of three-dimensional frequency dithering, the pseudo-randomness of a switching frequency signal that gets modulated into a radio frequency signal cannot be easily captured or measured via a radio frequency spectrum analyzer. As a result, three-dimensional frequency dithering of a switching signal of a switching power supply is the preferred mode of operation of a mobile terminal during normal use. The other frequency dithering modes discussed above are primarily useful for testing the operation of switching power supply 10 (FIG. 4) and circuit 14 (FIG. 6).

Figure 17A:
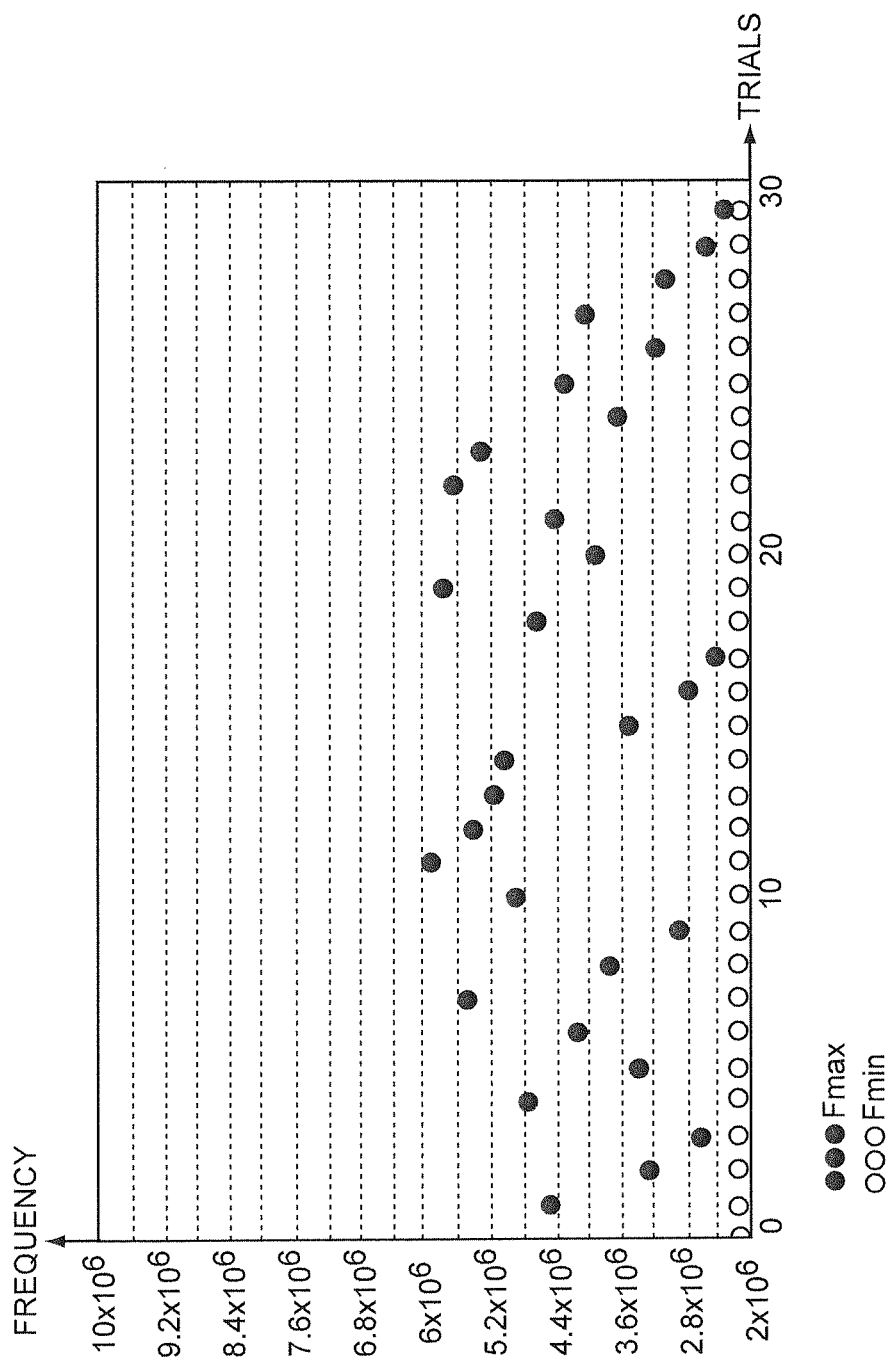
FIG. 17A is a graph representing a first case for generating Fmax values in which a random number is added to a fixed Fmin value to create a random Fmax value.
Figure 17B:
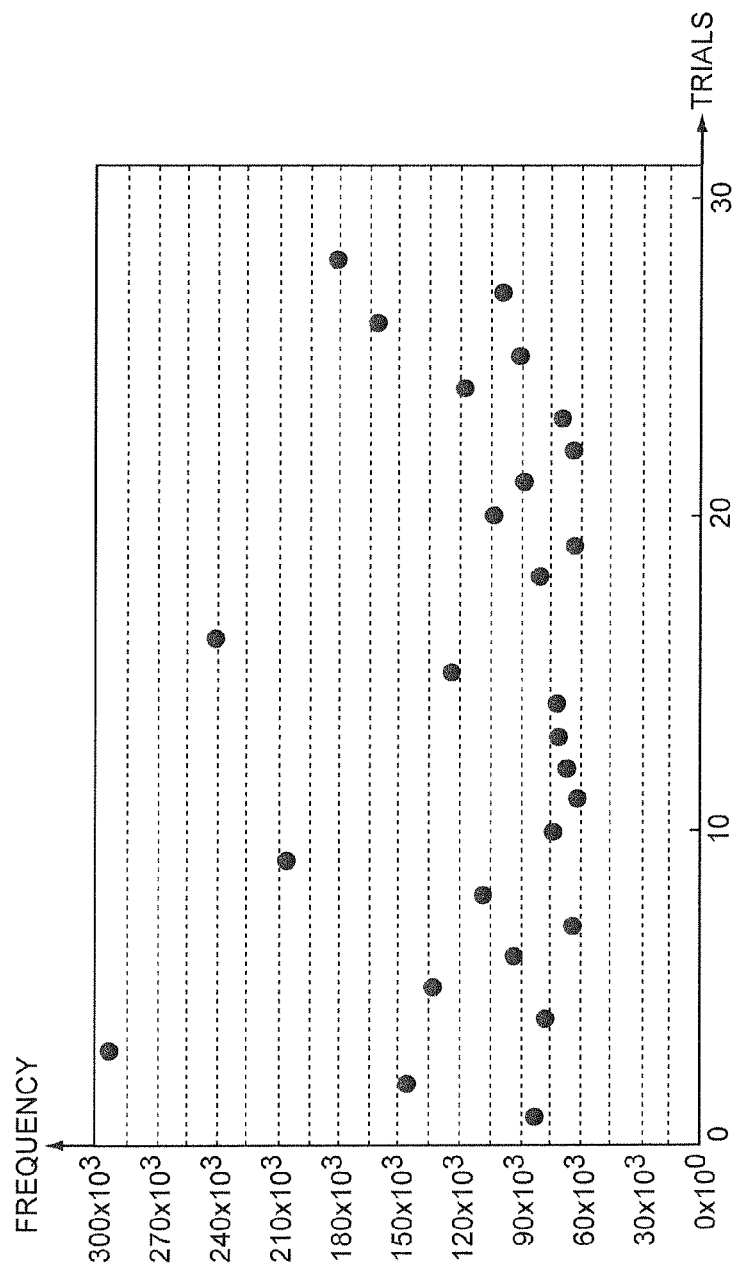
FIG. 17B is a graph showing the resulting dithering frequencies for the Fmin and Fmax values of FIG. 17A.

FIGS. 17A and 17B illustrate that the randomness of numbers generated by the MLSR 88 (FIG. 9) does translate into absolute and dithering frequency randomness. In a first case, a random number generated by the MLSR is added to an Fmin value to create Fmax. In this first case the Fmin value is fixed while the Fmax value is randomly changed. As a result, the switching frequency linearly changes back and forth between the Fmin value and the Fmax value. Thereby, generating a set of pseudo-random dithering frequencies. The Fmin value was chosen to be 2.0 MHz, and a 5-bit setting for the MLSR 88 that was used to generate the random numbers.

Figure 18A:
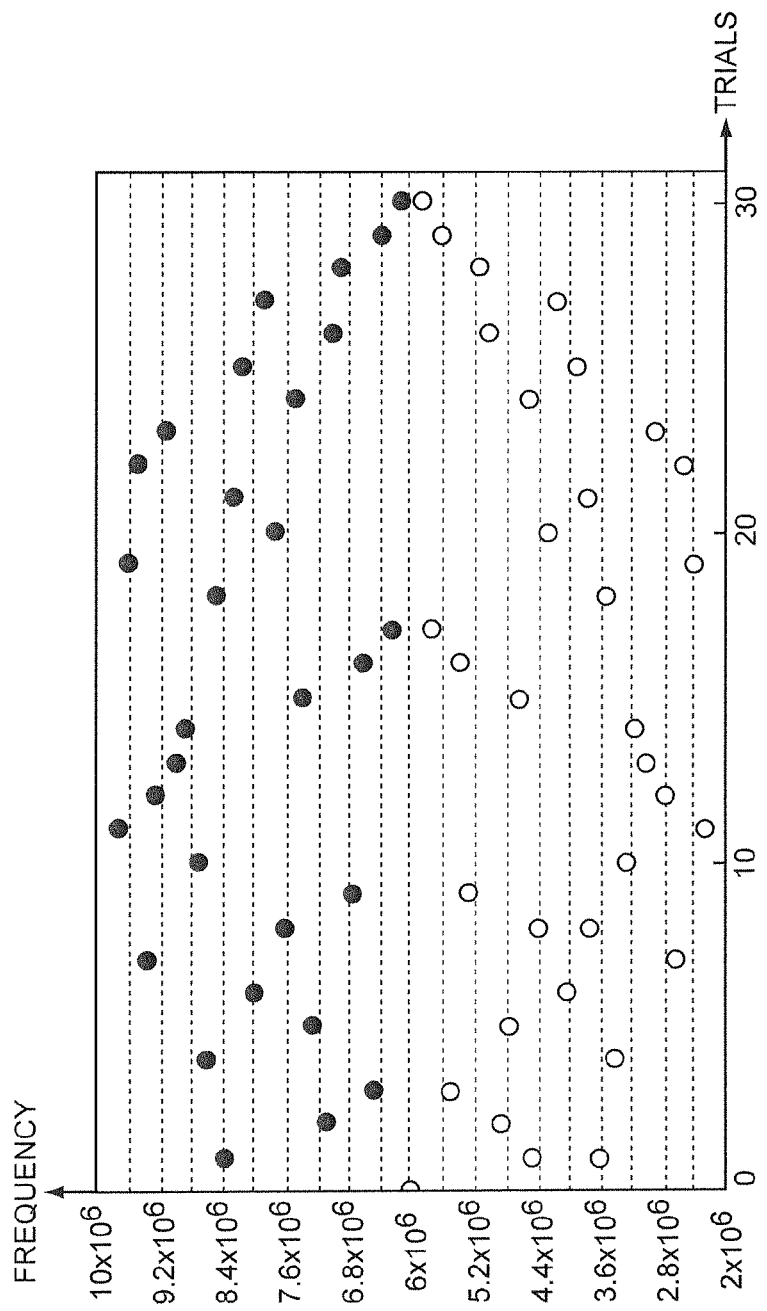
FIG. 18A is a graph representing a second case in which a random number is added to and subtracted from an average frequency value Fmean to generate a random Fmax value and a random Fmin value, respectively.
Figure 18B:
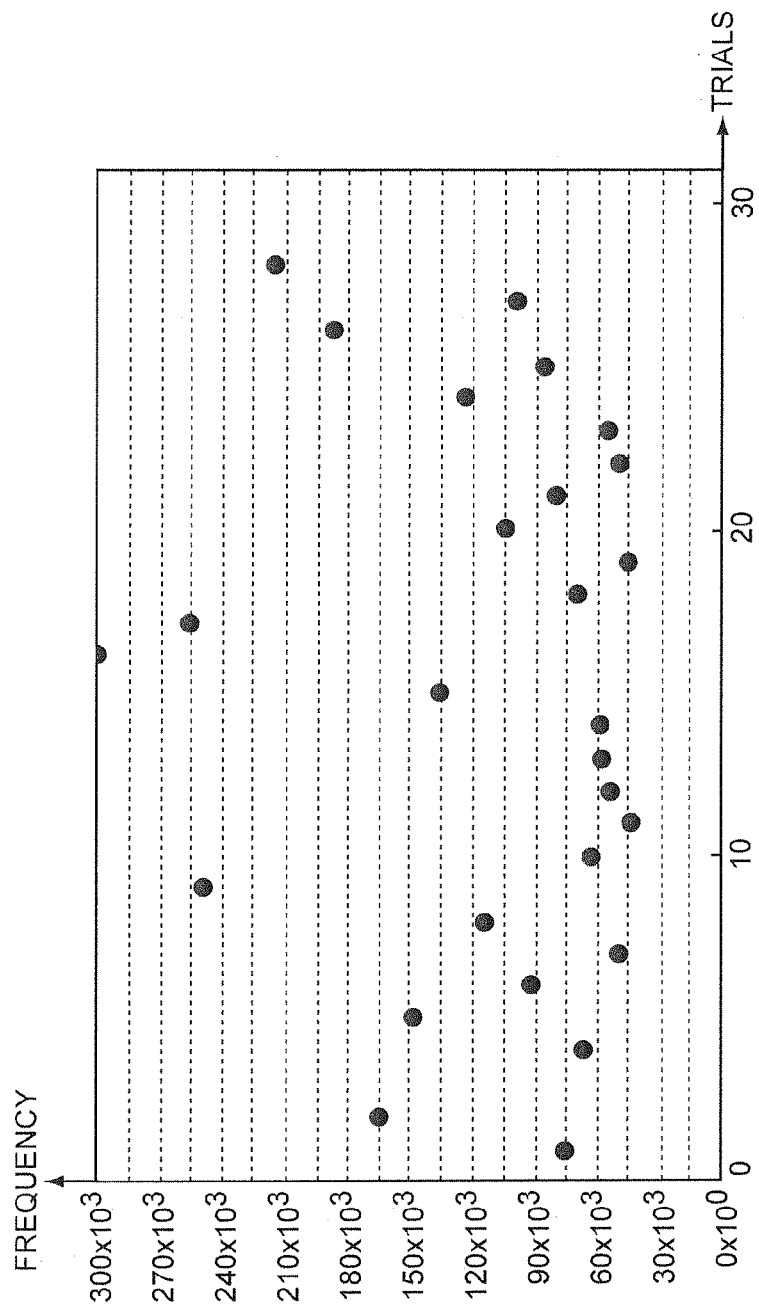
FIG. 18B is a graph showing the resulting dithering frequencies for the Fmin and Fmax values of FIG. 18A.

FIGS. 18A and 18B illustrate a second case in which a random number generated by MLSR 88 is added to an average Fmean value to generate a random Fmax value and subtracted from the Fmean value to generate a random Fmin value. In this second case, both the Fmin value and the Fmax value are randomly changed. Then the switching frequency linearly changes back and forth between the Fmin value and the Fmax value, thereby generating a set of dithering frequencies. The Fmean value was chosen to be 6.0 MHz, and the 5-bit setting for the MLSR 88 was used for generating the random numbers.

Figure 19A:
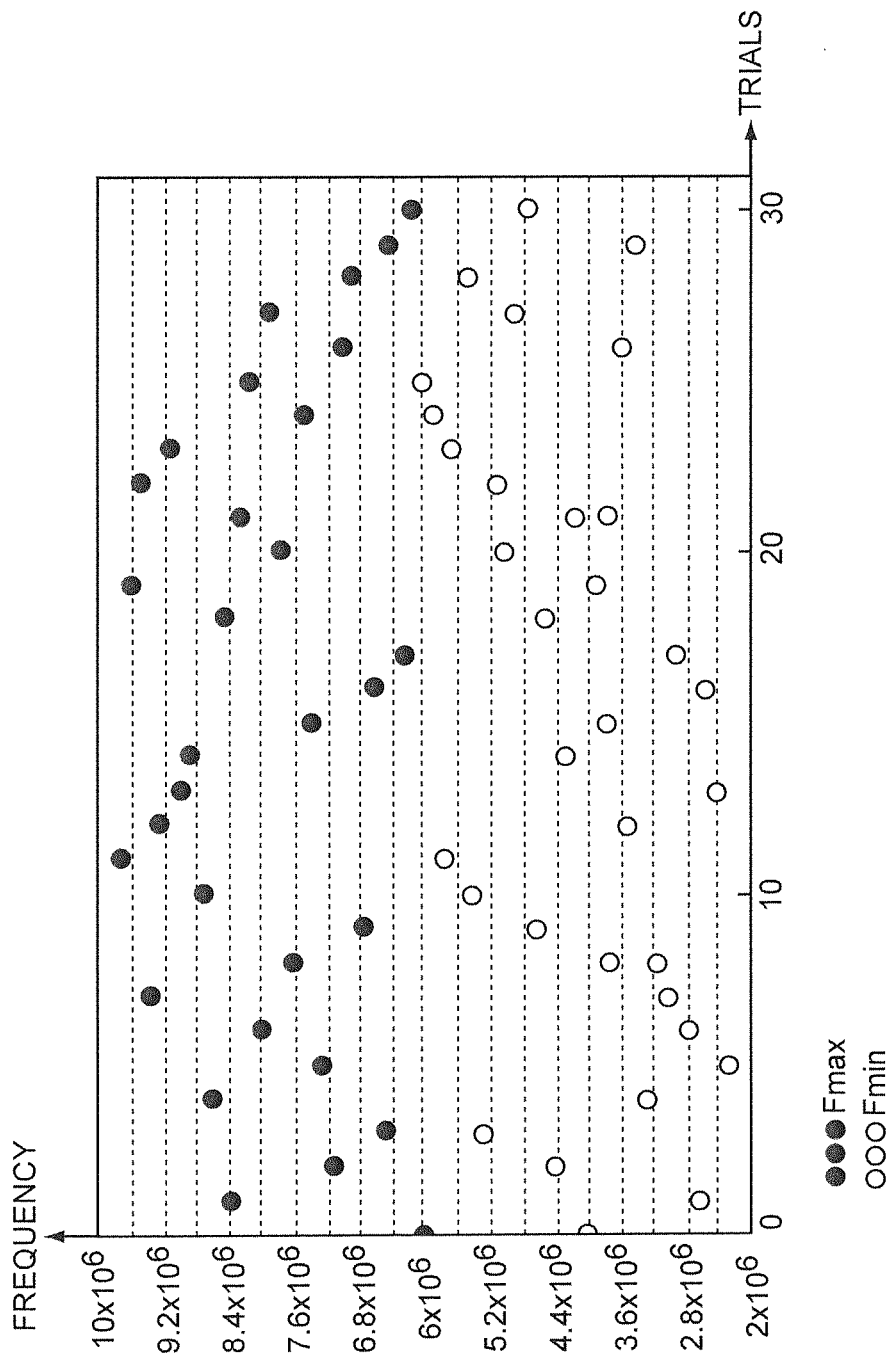
FIG. 19A is a graph representing a third case in which two random numbers are generated and wherein one random number is useable to generate a random Fmax value and the other random number is useable to generate a random Fmin value.
Figure 19B:
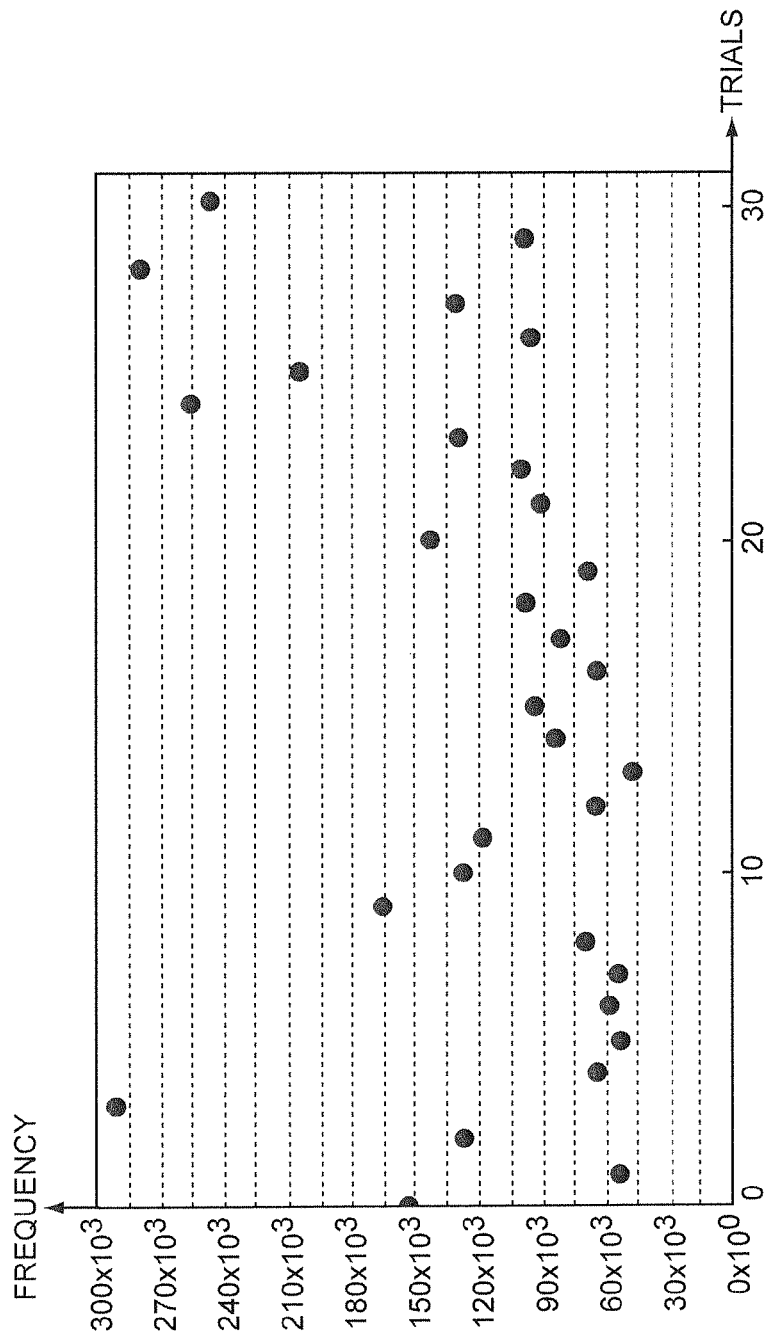
FIG. 19B is a graph showing the resulting dithering frequencies for the Fmin and Fmax values of FIG. 19A.

FIGS. 19A and 19B illustrate a third case in which two random number generators, identical to the MLSR 88 (FIG. 9), are used. Both random number generators have the same properties and taps, but the seed values for the random number generators are different. For example, a seed value of 10000b may be used for one random number generator, while a seed value of 00001 b may be used for the other random number generator. In this way, one set of random numbers is added to an average Fmean value to generate a random Fmax value. Another set of random numbers is subtracted from the Fmean value to generate a random Fmin value. In this case, both the Fmin value and the Fmax value are randomly changed. As a result, the switching frequency of the switching power supply 10 (FIG. 4) linearly changes back and forth between the Fmin value and the Fmax value. Thereby, generating a random set of dithering frequencies. The Fmean value was chosen to be 6.0 MHz, and the 5-bit setting was used for the random number generators.

As illustrated by FIGS. 17B, 18B and 19B, the variation of randomness between the three cases does not justify additional hardware and complications that may be required to support cases 2 and 3.

The implementation that supports case 1 will produce similar spurious spreading gain as the other cases and is therefore the preferred implementation. However, any implementation may be used without deviating from the teachings of the present disclosure.

Figure 20:
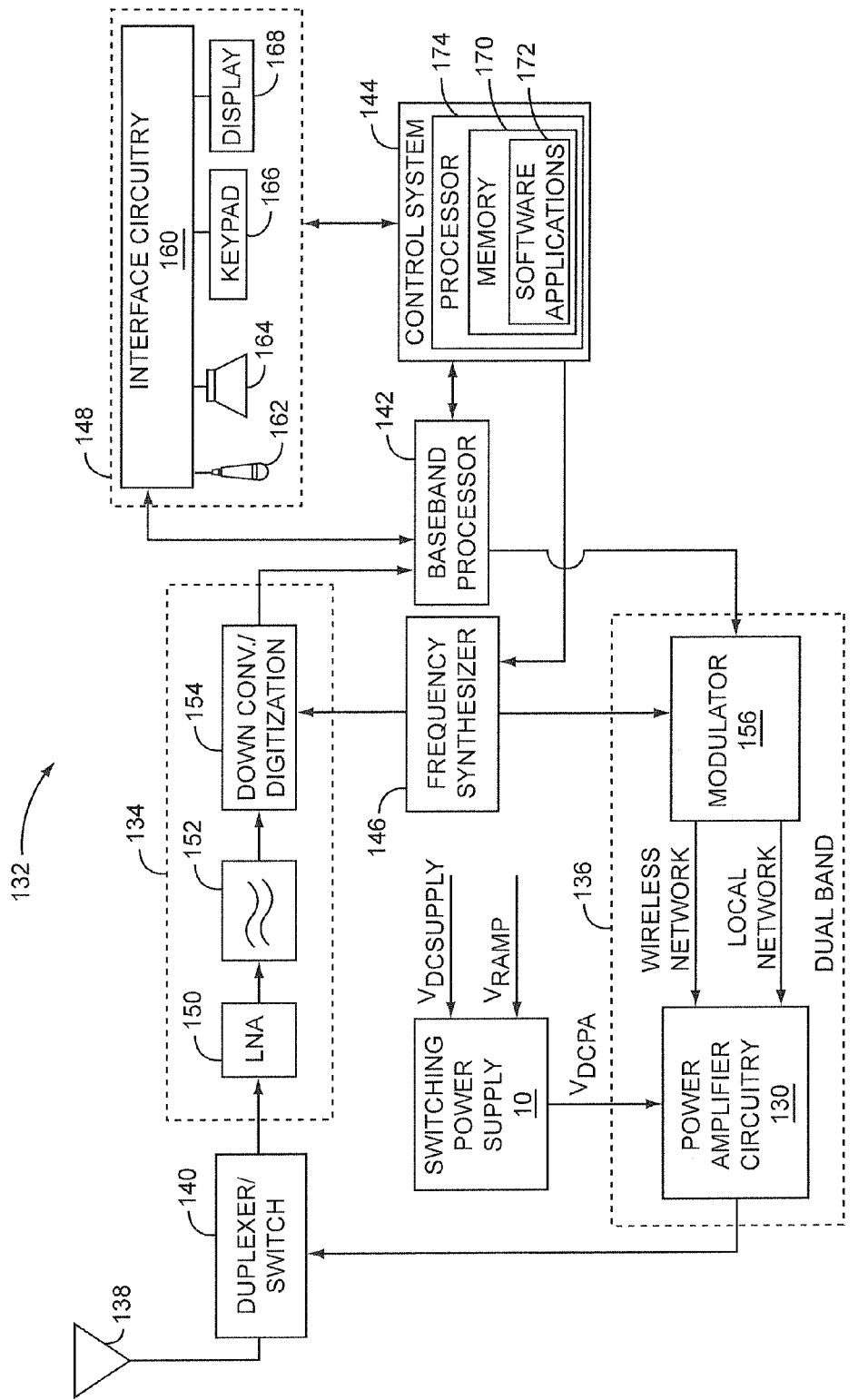
FIG. 20 depicts an application example of a mobile terminal that includes an embodiment of a switching power supply according to the present disclosure.

FIG. 20 depicts an application example of the switching power supply 10 (FIG. 4) feeding power to a power amplifier circuitry 130 that comprises a part of the basic architecture of a mobile terminal such as a wireless smart phone 132. The wireless smart phone 132 may include a receiver front end 134, a radio frequency transmitter section 136, an antenna 138, a duplexer or switch 140, a baseband processor 142, a control system 144, a frequency synthesizer 146, and a user interface 148. The receiver front end 134 receives information bearing radio frequency signals from one or more remote transmitters provided by a base station (not shown). A low noise amplifier 150 amplifies the signal. A filter circuit 152 minimizes broadband interference in the received signal, while downconversion and digitization circuitry 154 down-converts the filtered, received signal to an intermediate or baseband frequency signal, which is then digitized into one or more digital streams. The receiver front end 134 typically uses one or more mixing frequencies generated by the frequency synthesizer 146. The baseband processor 142 processes the digitized received signal to extract the information or data bits conveyed in the received signal. This processing typically comprises demodulation, decoding, and error correction operations. As such, the baseband processor 142 is generally implemented in one or more digital signal processors (DSPs).

On the transmit side, the baseband processor 142 receives digitized data, which may represent voice, data, or control information, from the control system 144, which it encodes for transmission. The encoded data is output to the radio frequency transmitter section 136, where it is used by a modulator 156 to modulate a carrier signal that is at a desired transmit frequency. The power amplifier circuitry 130 amplifies the modulated carrier signal to a level appropriate for transmission, and delivers the amplified and modulated carrier signal to the antenna 138 through the duplexer or switch 140.

A user may interact with the wireless smart phone 132 via the user interface 148, which may include interface circuitry 160 associated with a microphone 162, a speaker 164, a physical or virtual keypad 166, and a touch screen display 168. The interface circuitry 160 typically includes analog-to-digital converters, digital-to-analog converters, amplifiers, and the like. Additionally, the interface circuitry 160 may include a voice encoder/decoder, in which case the interface circuitry 160 may communicate directly with the baseband processor 142.

The microphone 162 will typically convert audio input, such as the user's voice, into an electrical signal, which is then digitized and passed directly or indirectly to the baseband processor 142. Audio information encoded in the received signal is recovered by the baseband processor 142 and converted by the interface circuitry 160 into an analog signal suitable for driving the speaker 164. The keypad 166 and the touch screen display 168 enable the user to interact with the wireless smart phone 132, input numbers to be dialed, address book information, or the like, as well as monitor call progress information.

The control system 144 includes a memory 170 for storing data and software applications 172, and a processor 174 for running the operating system and executing the software applications 172.

Those skilled in the art will recognize improvements and modifications to the present disclosure. All such improvements and modifications are considered within the scope of the concepts disclosed herein and the claims that follow.

What is claimed is:

1. A method for spreading a switching noise spectrum generated by a series of switching cycles of a switching circuit while transferring energy from a source to a load via the switching circuit, the method comprising:
   generating a pseudo-random value near a beginning of each of the series of switching cycles;
   determining a maximum switching frequency value based upon the pseudo-random value; and
   adjusting a switching frequency of the switching circuit incrementally from a fixed minimum switching frequency value to the maximum switching frequency value and adjusting the switching frequency of the switching circuit decrementally from the maximum switching frequency to the fixed minimum switching frequency during each of the series of switching cycles of the switching circuit.

2. The method of claim 1 wherein adjusting the switching frequency of the switching circuit is achieved using linear steps in frequency.

3. The method of claim 1 wherein determining the maximum switching frequency value is achieved by adding the pseudo-random value to the fixed minimum switching frequency value.

4. The method of claim 1 wherein the switching circuit is a direct current to direct current (DC-to-DC) converter.

5. The method of claim 4 wherein the DC-to-DC converter is adapted to supply power to a mobile terminal.

6. The method of claim 4 wherein the DC-to-DC converter is adapted to supply power to a radio frequency power amplifier (RF PA).

7. The method of claim 1 wherein determining a maximum switching frequency value is achieved by adding the pseudo-random value to the minimum switching frequency value.

8. A circuit comprising:
   switching circuitry adapted to:
      receive a switching signal having a series of switching cycles and a switching frequency;
      transfer energy from a source to a load; and
   control circuitry adapted to:
      generate a pseudo-random value near a beginning of each of the series of switching cycles;
      determine a maximum switching frequency value based upon the pseudo-random value; and
      adjust the switching frequency of the switching signal incrementally from a fixed minimum switching frequency value to the maximum switching frequency value and adjust the switching frequency of the switching circuit decrementally from the maximum switching frequency to the fixed minimum switching frequency during each of the series of switching cycles of the switching circuitry.

9. The circuit of claim 8 wherein the control circuitry includes a maximum length shift register (MLSR) that is adapted to generate the pseudo-random value.

10. The circuit of claim 9 further including an adder circuit adapted to add a pseudo-random value generated by the MLSR to the fixed minimum switching frequency value.

11. The circuit of claim 8 further including a frequency generator for generating switching frequencies that range between the fixed minimum switching frequency value and the maximum switching frequency value based upon the pseudo-random value.

12. The circuit of claim 11 further including a propagation delay compensator adapted to maintain linearity between generated switching frequencies and a set of generated pseudo-random codes.

13. The circuit of claim 8 wherein the switching circuitry is a direct current to direct current (DC-to-DC) converter.

14. The circuit of claim 13 wherein the DC-to-DC converter is adapted to supply power to a mobile terminal.

15. The circuit of claim 14 wherein the DC-to-DC converter is adapted to supply power to a radio frequency power amplifier (RF PA).

* * * * *

UNITED STATES PATENT AND TRADEMARK OFFICE
CERTIFICATE OF CORRECTION

| | | |
|---|---|---|
| PATENT NO. | : 9,166,471 B1 | Page 1 of 1 |
| APPLICATION NO. | : 12/723738 | |
| DATED | : October 20, 2015 | |
| INVENTOR(S) | : Chris Levesque, James Retz and Christopher T. Ngo | |

It is certified that error appears in the above-identified patent and that said Letters Patent is hereby corrected as shown below:

In the Specification:

In column 11, in lines 3 and 9 of the equation, replace "Numer_of_Trials" with --Number_of_Trials--.

Signed and Sealed this
Nineteenth Day of July, 2016

Michelle K. Lee
*Director of the United States Patent and Trademark Office*